(12) United States Patent
Jurasek et al.

(10) Patent No.: US 8,891,294 B2
(45) Date of Patent: *Nov. 18, 2014

(54) MULTILEVEL DIFFERENTIAL SENSING IN PHASE CHANGE MEMORY

(71) Applicant: Being Advanced Memory Corporation, Essex Junction, VT (US)

(72) Inventors: Ryan A. Jurasek, Burlington, VT (US); Aaron D. Willey, Burlington, VT (US)

(73) Assignee: Being Advanced Memory Corporation, Williston, VT (US)

( * ) Notice: Subject to any disclaimer, the term of this patent is extended or adjusted under 35 U.S.C. 154(b) by 20 days.

This patent is subject to a terminal disclaimer.

(21) Appl. No.: 13/869,338

(22) Filed: Apr. 24, 2013

(65) Prior Publication Data

US 2014/0071746 A1 Mar. 13, 2014

Related U.S. Application Data

(60) Provisional application No. 61/698,532, filed on Sep. 7, 2012.

(51) Int. Cl.
*G11C 13/04* (2006.01)
*G11C 13/00* (2006.01)

(52) U.S. Cl.
CPC .......... *G11C 13/004* (2013.01); *G11C 13/0069* (2013.01); *G11C 13/0004* (2013.01)
USPC .......................................... 365/163; 365/148

(58) Field of Classification Search
None
See application file for complete search history.

(56) References Cited

U.S. PATENT DOCUMENTS

| | | | |
|---|---|---|---|
| 2007/0285966 A1 * | 12/2007 | Toda et al. ................. | 365/148 |
| 2008/0151612 A1 | 6/2008 | Pellizzer | |
| 2011/0103139 A1 | 5/2011 | Kau et al. | |
| 2012/0099370 A1 | 4/2012 | Toda | |

FOREIGN PATENT DOCUMENTS

| | | |
|---|---|---|
| CN | 102270505 A | 12/2011 |
| CN | 102332302 A | 1/2012 |
| CN | 102594315 A | 7/2012 |
| CN | 102637453 A | 8/2012 |
| CN | 103165179 A | 6/2013 |
| CN | 103165181 A | 6/2013 |
| KR | 20070063801 A | 6/2007 |
| KR | 1020070063801 | 6/2007 |
| WO | 2011095902 | 8/2011 |
| WO | 2011095902 A1 | 8/2011 |

OTHER PUBLICATIONS

KIPO International Search Report for PCT/US2013/037945.
KIPO Written Opinion for PCT/US2013/037945.

* cited by examiner

*Primary Examiner* — James G Norman
(74) *Attorney, Agent, or Firm* — Robert O. Groover, III; Gwendolyn S. S. Groover; Seth A. Horwitz

(57) ABSTRACT

Methods and systems for multi-bit phase change memories. Using differential sensing for memory reads provides advantages including improved temperature and drift resilience, improved state discrimination and increased storage density.

16 Claims, 30 Drawing Sheets

| Distinct State Number | Cell0 | Cell1 | Cell2 |
|---|---|---|---|
| 1 | 0 | 1 | 2 |
| 2 | 0 | 2 | 1 |
| 3 | 1 | 0 | 2 |
| 4 | 1 | 2 | 0 |
| 5 | 2 | 0 | 1 |
| 6 | 2 | 1 | 0 |

FIG. 11B

| Distinct State Number | Cell0 | Cell1 | Cell2 |
|---|---|---|---|
| 1 | 0<br>1<br>2 | 0<br>1<br>2 | 0<br>1<br>2 |
| 2 | 0<br>0<br>1 | 0<br>0<br>1 | 1<br>2<br>2 |
| 3 | 0<br>0<br>1 | 1<br>2<br>2 | 0<br>0<br>1 |
| 4 | 1<br>2<br>2 | 0<br>0<br>1 | 0<br>0<br>1 |
| 5 | 0<br>0<br>1 | 1<br>2<br>2 | 1<br>2<br>2 |
| 6 | 1<br>2<br>2 | 0<br>0<br>1 | 1<br>2<br>2 |
| 7 | 1<br>2<br>2 | 1<br>2<br>2 | 0<br>0<br>1 |
| 8 | 0 | 1 | 2 |
| 9 | 0 | 2 | 1 |
| 10 | 1 | 0 | 2 |
| 11 | 1 | 2 | 0 |
| 12 | 2 | 0 | 1 |
| 13 | 2 | 1 | 0 |

FIG. 11D

MULTILEVEL DIFFERENTIAL SENSING IN PHASE CHANGE MEMORY

CROSS-REFERENCE

Priority is claimed from U.S. Provisional Patent Applications No. 61/698,532 filed Sep. 7, 2012, which is hereby incorporated by reference.

BACKGROUND

The present application relates to multi-bit phase change memory (PCM) devices, arrays, subarrays, blocks, systems, and methods, and more particularly to architectures for improving read reliability thereof. More particularly, the present application relates to perfecting temperature and resistance drift tracking when using multi-bit phase change memory cells.

Note that the points discussed below may reflect the hindsight gained from the disclosed inventions, and are not necessarily admitted to be prior art.

Phase change memory ("PCM") is a relatively new nonvolatile memory technology, which is very different from any other kind of nonvolatile memory. First, the fundamental principles of operation, at the smallest scale, are different: no other kind of solid-state memory uses a reversible PHYSICAL change to store data. Second, in order to achieve that permanent physical change, an array of PCM cells has to allow read, set, and reset operations which are all very different from each other. The electrical requirements of the read, set, and reset operations make the peripheral circuit operations of a PCM very different from those of other nonvolatile memories. Obviously some functions, such address decoding and bus interface, can be the same; but the closest-in parts of the periphery, which perform set, reset, and read operations on an array or subarray, must satisfy some unique requirements.

The physical state of a PCM cell's memory material is detected as resistance. For each selected cell, its bitline is set to a known voltage, and the cell's access transistor is turned on (by the appropriate wordline). If the cell is in its low-resistance state, it will sink a significant current from the bit line; if it is not, it will not.

Set and Reset operations are more complicated. Both involve heat. As discussed below, a "set" operation induces the memory material to recrystallize into its low-resistance (polycrystalline) state; a "reset" operation anneals the memory material into its high-resistance (amorphous) state.

Write operations (Set and Reset) normally have more time budget than read operations. In read mode a commercial PCM memory should be competitive with the access speed (and latency if possible) of a standard DRAM. If this degree of read speed can be achieved, PCM becomes very attractive for many applications.

The phase change material is typically a chalcogenide glass, using amorphous and crystalline (or polycrystalline) phase states to represent bit states.

A complete PCM cell can include, for example: a top electrode (connected to the bit line), a phase change material (e.g. a chalcogenide glass), a conductive pillar which reaches down from the bottom of the phase change material, an access transistor (gated by a word line), and a bottom connection to ground. The phase change material can extend over multiple cells (or over the whole array), but the access transistors are laterally isolated from each other by a dielectric.

FIG. 2A shows an example of a PCM element 2010. A top electrode 2020 overlies a phase change material 2030, e.g. a chalcogenide glass. Note that material 2030 also includes a mushroom-shaped annealed zone (portion) 2070 within it. (The annealed zone 2070 may or may not be present, depending on what data has been stored in this particular location.) The annealed zone 2070, if present, has a much higher resistivity than the other (crystalline or polycrystalline) parts of the material 2030.

A conductive pillar 2050 connects the material 2030 to a bottom electrode 2040. In this example, no selection device is shown; in practice, an access transistor would normally be connected in series with the phase change material. The pillar 2050 is embedded in an insulator layer 2060.

When voltage is applied between the top 2020 and bottom 2040 electrodes, the voltage drop will appear across the high-resistivity zone 2070 (if present). If sufficient voltage is applied, breakdown will occur across the high-resistivity zone. In this state the material will become very conductive, with large populations of mobile carriers. The material will therefore pass current, and current crowding can occur near the top of the pillar 2050. The voltage which initiates this conduction is referred to as the "snapback" voltage, and FIG. 2C shows why.

FIG. 2C shows an example of instantaneous I-V curves for a device like that of FIG. 2A, in two different states. Three zones of operation are marked.

In the zone 2200 marked "READ," the device will act either as a resistor or as an open (perhaps with some leakage). A small applied voltage will result in a state-dependent difference in current, which can be detected.

However, the curve with open circles, corresponding to the amorphous state of the device, shows some more complex behaviors. The two curves show behaviors under conditions of higher voltage and higher current.

If the voltage reaches the threshold voltage $V_{th}$, current increases dramatically without any increase in voltage. (This occurs when breakdown occurs, so the phase-change material suddenly has a large population of mobile carriers.) Further increases in applied voltage above $V_{th}$ result in further increases in current; note that this upper branch of the curve with hollow circles shows a lower resistance than the curve with solid squares.

If the applied voltage is stepped up to reach the zone 2150, the behavior of the cell is now independent of its previous state.

When relatively large currents are applied, localized heating will occur at the top of the pillar 2050, due to the relatively high current density. Current densities with typical dimensions can be in the range of tens of millions of Amperes per square cm. This is enough to produce significant localized heating within the phase-change material.

This localized heating is used to change the state of the phase-change material, as shown in FIG. 2B. If maximum current is applied in a very brief pulse 2100 and then abruptly stopped, the material will tend to quench into an amorphous high-resistivity condition; if the phase-change material is cooled more gradually and/or not heated as high as zone 2150, the material can recrystallize into a low-resistivity condition. Conversion to the high-resistance state is normally referred to as "Reset", and conversion to the low-resistance state is normally referred to as "Set" (operation 2080). Note that, in this example, the Set pulse has a tail where current is reduced fairly gradually, but the Reset pulse does not. The duration of the Set pulse is also much longer than that of the Reset pulse, e.g. tens of microseconds versus hundreds of nanoseconds.

FIG. 2D shows an example of temperature versus resistivity for various PCM materials. It can be seen that each curve has a notable resistivity drop 2210 at some particular temperature. These resistivity drops correspond to phase change to a crystalline (or polysilicon) state. If the material is cooled gradually, it remains in the low resistivity state after cooling.

In a single-bit PCM, as described above, only two phases are distinguished: either the cell does or does not have a significant high-resistivity "mushroom cap" 2070. However, it is also possible to distinguish between different states of the mushroom cap 2070, and thereby store more than one bit per cell.

FIG. 2E shows an equivalent circuit for an "upside down" PCM cell 2010. In this example the pass transistor 2240 is gated by Wordline 2230, and is connected between the phase-change material 2250 and the bitline 2220. (Instead, it is somewhat preferable to connect this transistor between ground and the phase-change material.

FIG. 2F shows another example of a PCM cell 2010. A bitline 2220 is connected to the top electrode 2020 of the phase-change material 2250, and transistor 2240 which is connected to the bottom electrode 2030 of the PCM element. (The wordline 2230 which gates the vertical transistor 2240 is not shown in this drawing.) Lines 2232, which are shown as separate (and would be in a diode array), may instead be a continuous sheet, and provide the ground connection.

FIG. 2G shows an example of resistance (R) over time (t) for a single PCM cell following a single PCM write event at time t=0. The resistance curve 2400 for a cell which has been reset (i.e. which is in its high-resistance state) may rise at first, but then drifts significantly lower. The resistance curve 2410 for a cell in the Set state is much flatter. The sense margin 2420, i.e., the difference between set and reset resistances, also decreases over time. Larger sense margins generally result in more reliable reads, and a sense margin which is too small may not permit reliable reading at all. 2G represents the approximate behavior of one known PCM material; other PCM material compositions may behave differently. For example, other PCM material compositions may display variation of the set resistance over time.

The downwards drift of reset resistance may be due to, for example, shrinking size of the amorphous zone of the phase-change material, due to crystal growth; and, in some cells, spontaneous nucleation steepening the drift curve (possibly only slightly) due to introducing further conductive elements into the mushroom-shaped programmable region.

FIG. 2H shows an example of a processing system 2300. Typically, a processing system 2300 will incorporate at least some of interconnected power supplies 2310, processor units 2320 performing processing functions, memory units 2330 supplying stored data and instructions, and I/O units 2340 controlling communications internally and with external devices 2350.

FIG. 2I shows an example of a PCM single ended sensing memory. Two different PCM cells 2400 on different ends of a sense amplifier can be selected separately. Selected elements 2410 are separately sensed by a single-ended sense amplifier 2420.

FIG. 2J shows an example of a known PCM single ended sense amplifier 2500. Generally, in a single ended sense amplifier, a cell read output conducted by a selected bitline BLB is compared against a reference current to provide a digital output OUT. When the PRECHARGE signal turns on transistor 2530, voltage V04 (e.g., 400 mV) precharges the bitline BLB. After precharge ends, the READ signal turns on transistor 2550. Transistor 2550 is connected, through source follower 2560 and load 2580, to provide a voltage which comparator 2600 compares to Voltage_REF, to thereby generate the digital output OUT.

A variety of nonvolatile memory technologies have been proposed over recent decades, and many of them have required some engineering to provide reference values for sensing. However, the requirements and constraints of phase-change memory are fundamentally different from those of any other kind of nonvolatile memory. Many memory technologies (such as EEPROM, EPROM, MNOS, and flash) test the threshold voltage of the transistor in a selected cell, so referencing must allow for the transistor's behavior. By contrast, phase-change memory simply senses the resistance of the selected cell. This avoids the complexities of providing a reference which will distinguish two (or more) possibilities for an active device's state, but does require detecting a resistance value, and tracking external variations (e.g. temperature and supply voltage) which may affect the instantaneous value of that resistance.

The possibility of storing more than one bit of data in a single phase-change material has also been suggested. Phase-change memories implementing such architectures are referred to here as "multibit" PCMs. If the "Set" and/or "Reset" operations can be controlled to produce multiple electrically distinguishable states, then more than one bit of information can be stored in each phase-change material location. It is known that the current over time profile of the Set operation can be controlled to produce electrically distinguishable results, though this can be due to more than one effect. In the simplest implementation, shorter anneals—too short to produce full annealing of the amorphous layer—can be used to produce one or more intermediate states. In some materials, different crystalline phases can also be produced by appropriate selection of the current over time profile. However, what is important for the present application is merely that electrically distinguishable states can be produced.

For example, if the complete layer of phase-change material can have four possible I/V characteristics, two bits of information can be stored in each cell—IF the read cycle can accurately distinguish among the four different states.

(The I/V characteristics of the cells which are not in the fully Set state are typically nonlinear, so it is more accurate to distinguish the states in terms of current flow at a given voltage; resistance is often used as a shorthand term, but implies a linearity which may not be present.)

In order to make use of the possible multibit cell structures, it is necessary to reliably distinguish among the possible states. To make this distinction reliably, there must be some margin of safety, despite the change in characteristics which may occur due to history, manufacturing tolerances, and environmental factors. Thus the read architecture of multibit PCMs is a far more difficult challenge it is for PCMs with single-bit cells.

SUMMARY

The present application discloses new multibit phase change memory architectures. Data is stored in groups of n n-bit cells, where every one of the n possible states appears in exactly one of the n cells. Each group of cells is read out at the same time, and differential sensing permits the collective state of the group to be read accurately. Since it is predetermined that each cell group contains all possible states, EACH CELL GROUP PROVIDES ITS OWN REFERENCE. Since there is no need for a separate reference, there is no possibility of a reference behaving differently from the data storage cells. Preferably a fully differential sensing architecture is used, so that every pair of outputs (in a given group) is compared against each other.

The use of collective states means that each group of n n-bit cells can have any one of n! (n factorial) states. For example, with 3 states per cell, a group of three cells is collectively encoded, and 6 collective states (3 factorial) are possible. Three comparators produce three digital outputs to indicate which collective state is present. (Each collective state corresponds to a unique set of digital outputs, but not every combination of digital outputs corresponds to a possible collective state.) With four 4-state cells, 24 collective states are possible. Six comparators provide six outputs, and each of the 24 collective states corresponds to some value of these six bits. Note that the collective states of four 4-state cells contain more information than four one-bit cells could. ($4!=24>16=2^n$.)

In other words, in this example, multi-bit PCM with differential sensing provides all the robust sensing advantages of differential sensing while also providing (generally) between 14% and 50% increase in information storage density over single-bit PCM with single ended sensing with approximately equivalent sense margins.

The disclosed innovations, in various embodiments, provide one or more of at least the following advantages. However, not all of these advantages result from every one of the innovations disclosed, and this list of advantages does not limit the various claimed inventions.

Increased PCM element resistance drift tolerance;
increased PCM element temperature change tolerance on reads;
increased PCM read signal margin, i.e. a greater ability to discriminate between different multi-bit PCM resistance states;
increased memory/area quotient;
the number of states used for multibit memory does not have to be a power of 2, e.g. groups of three 3-state cells or five 5-state cells can be used. This permits incremental improvements in process control and sense circuits to be rapidly exploited, without making the difficult transition from 4-state cells to 8-state cells.
substantially perfect temperature and resistance drift tracking across co-addressed groups of PCM cells; and
more reliable PCM memory reads.

BRIEF DESCRIPTION OF THE DRAWINGS

The disclosed inventions will be described with reference to the accompanying drawings, which show important sample embodiments and which are incorporated in the specification hereof by reference, wherein:

FIG. 11B shows an example of a state table.

FIG. 11D shows an example of a state table.

DETAILED DESCRIPTION OF SAMPLE EMBODIMENTS

Figure 1:
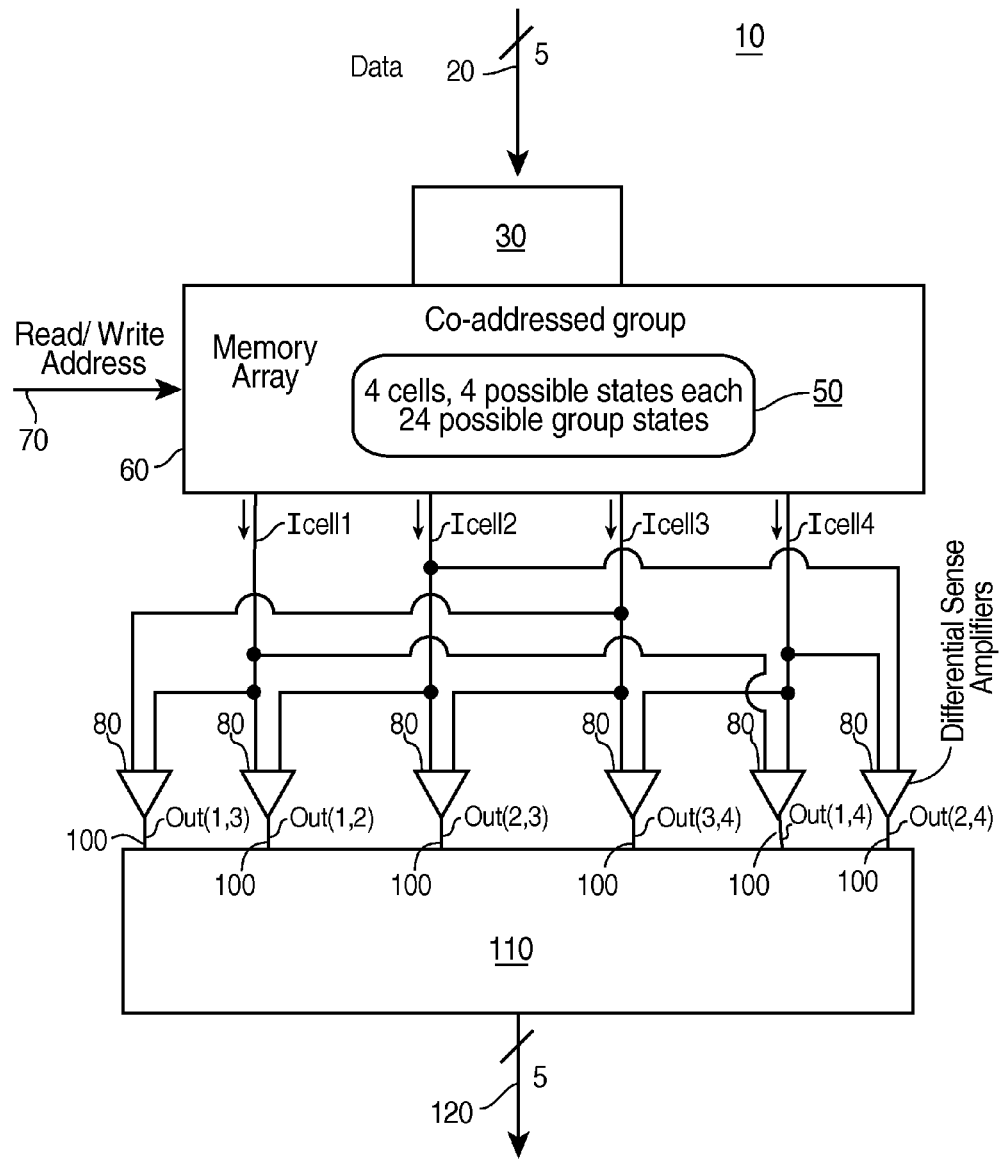
FIG. 1 shows an example of a Multi-Differential Multi-Bit PCM memory.
Figure 2A:
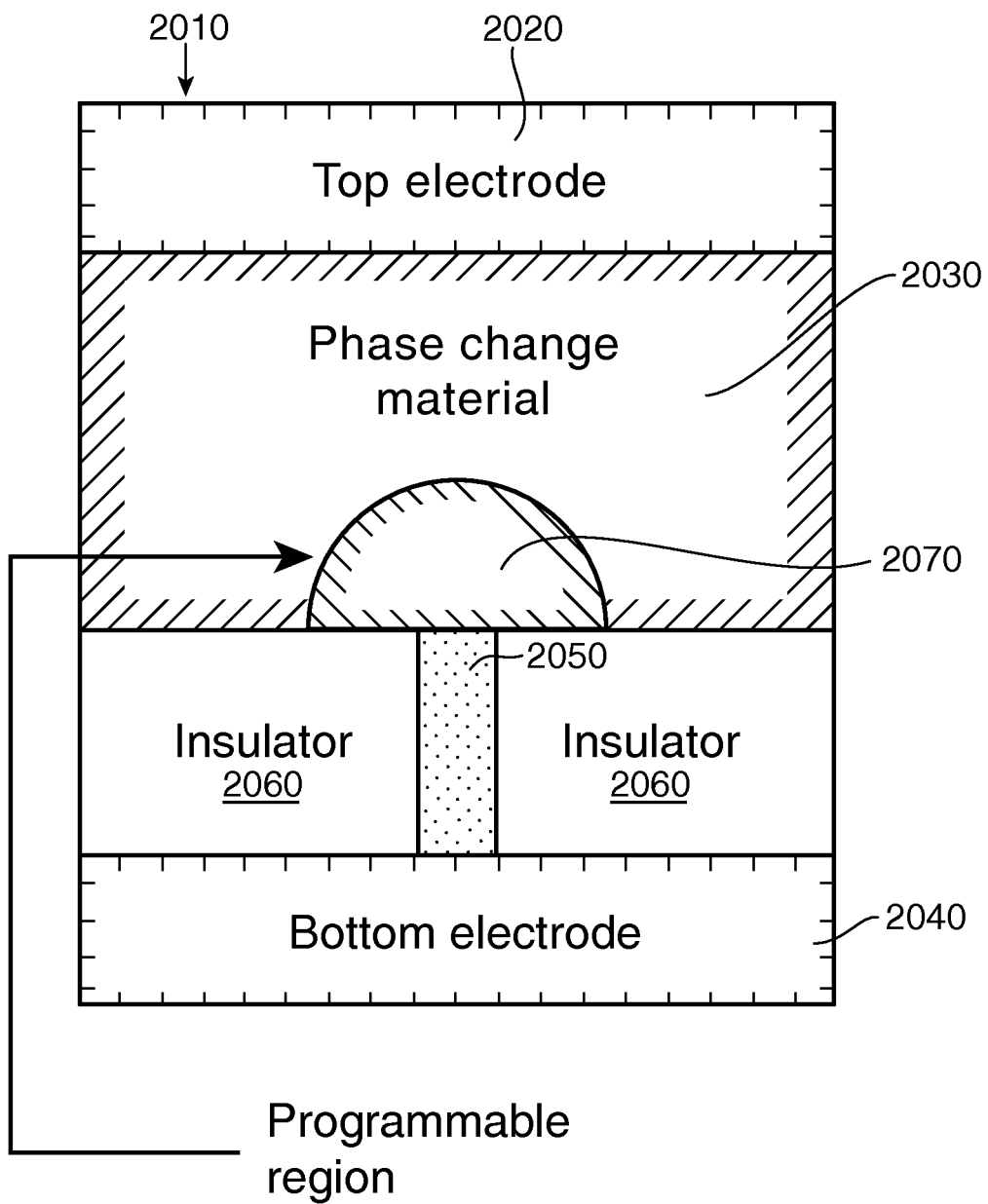
FIG. 2A shows an example of a PCM element.
Figure 2B:
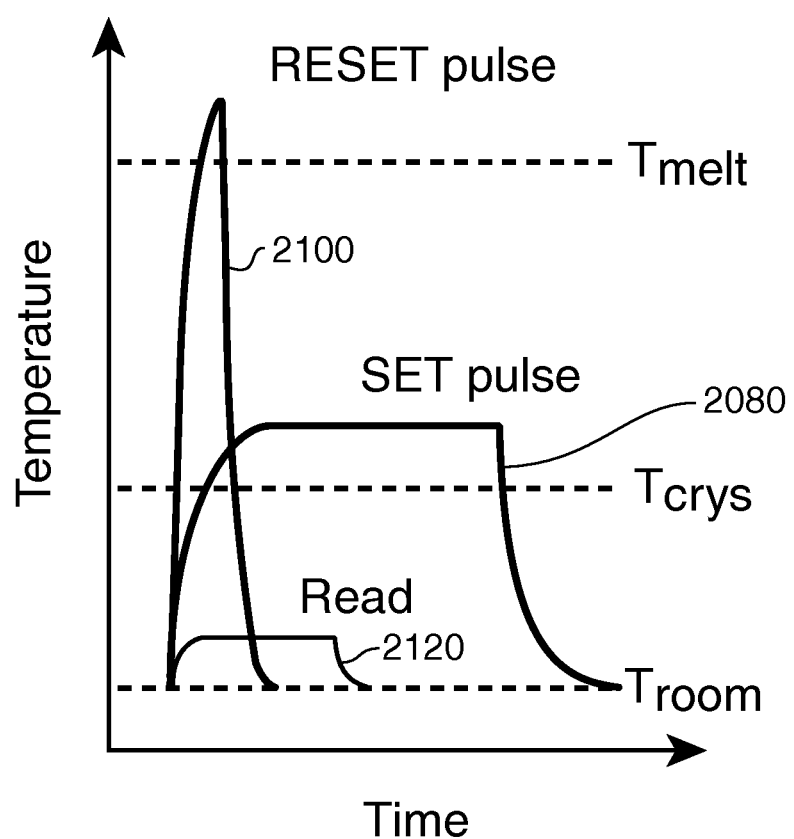
FIG. 2B shows an example of PCM bit line signals.
Figure 2C:
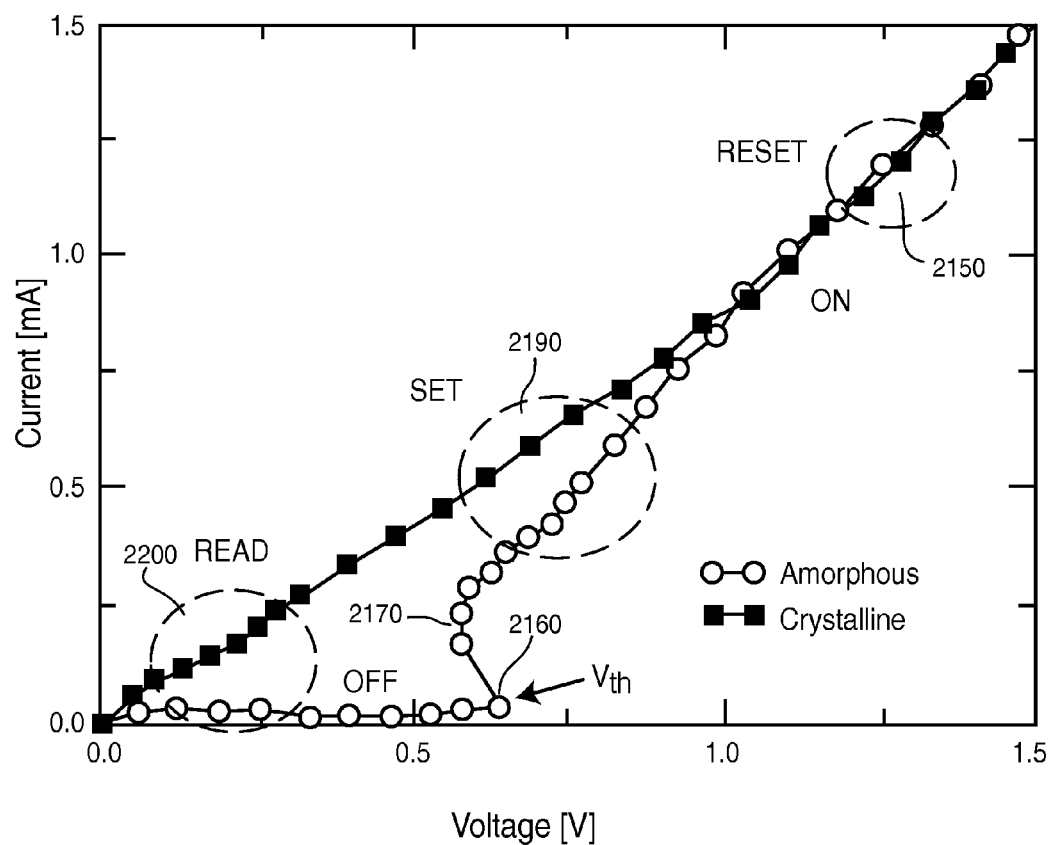
FIG. 2C shows an example of voltage versus current in a PCM material.
Figure 2D:
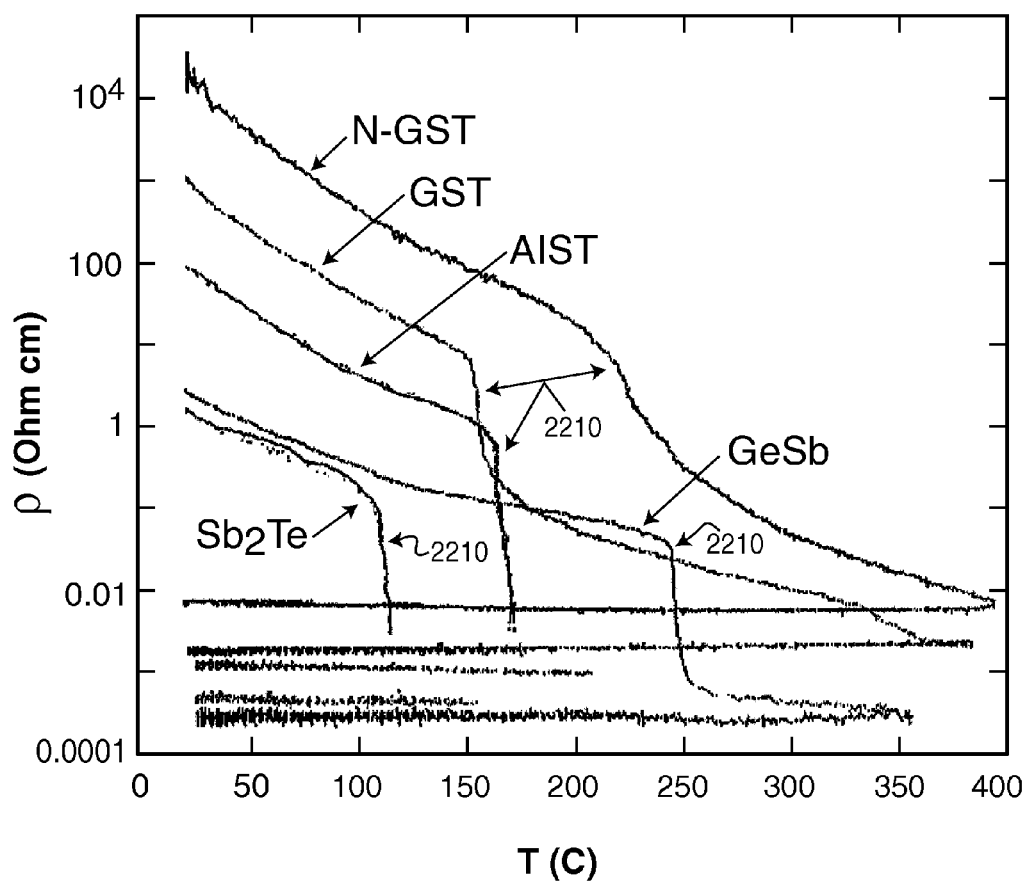
FIG. 2D shows an example of temperature versus resistance in a PCM material.
Figure 2E:
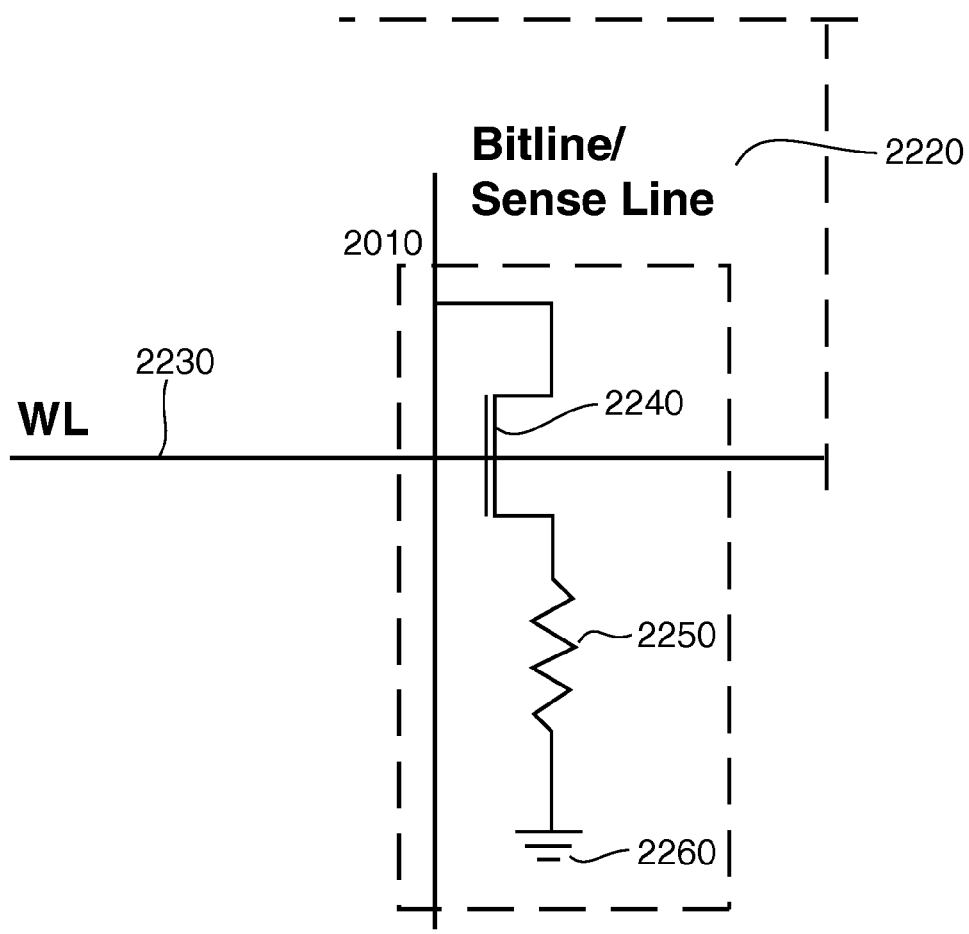
FIG. 2E shows an example of a PCM cell.
Figure 2F:
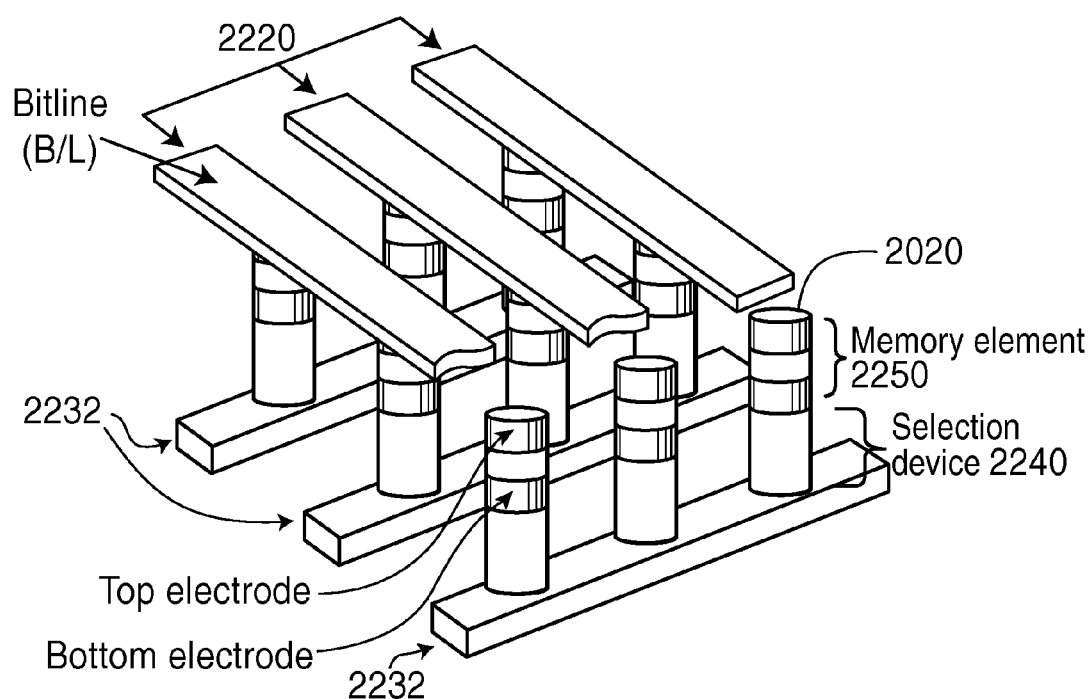
FIG. 2F shows an example of a PCM cell.
Figure 2G:
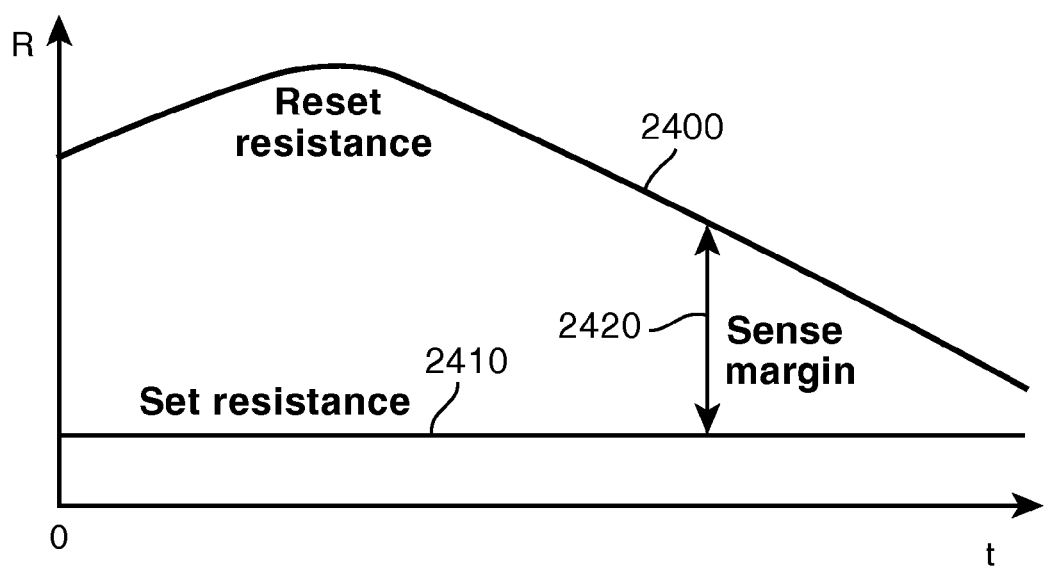
FIG. 2G shows an example of resistance over time for a PCM cell.
Figure 2H:
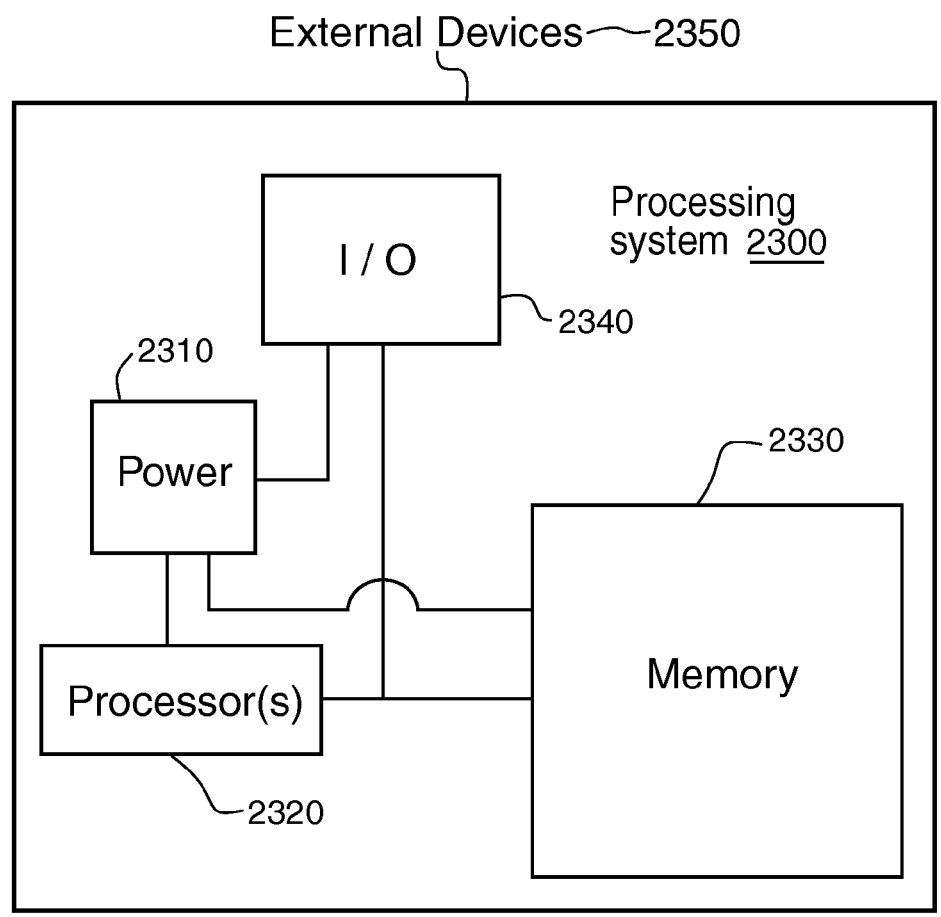
FIG. 2H shows an example of a processing system.
Figure 2I:
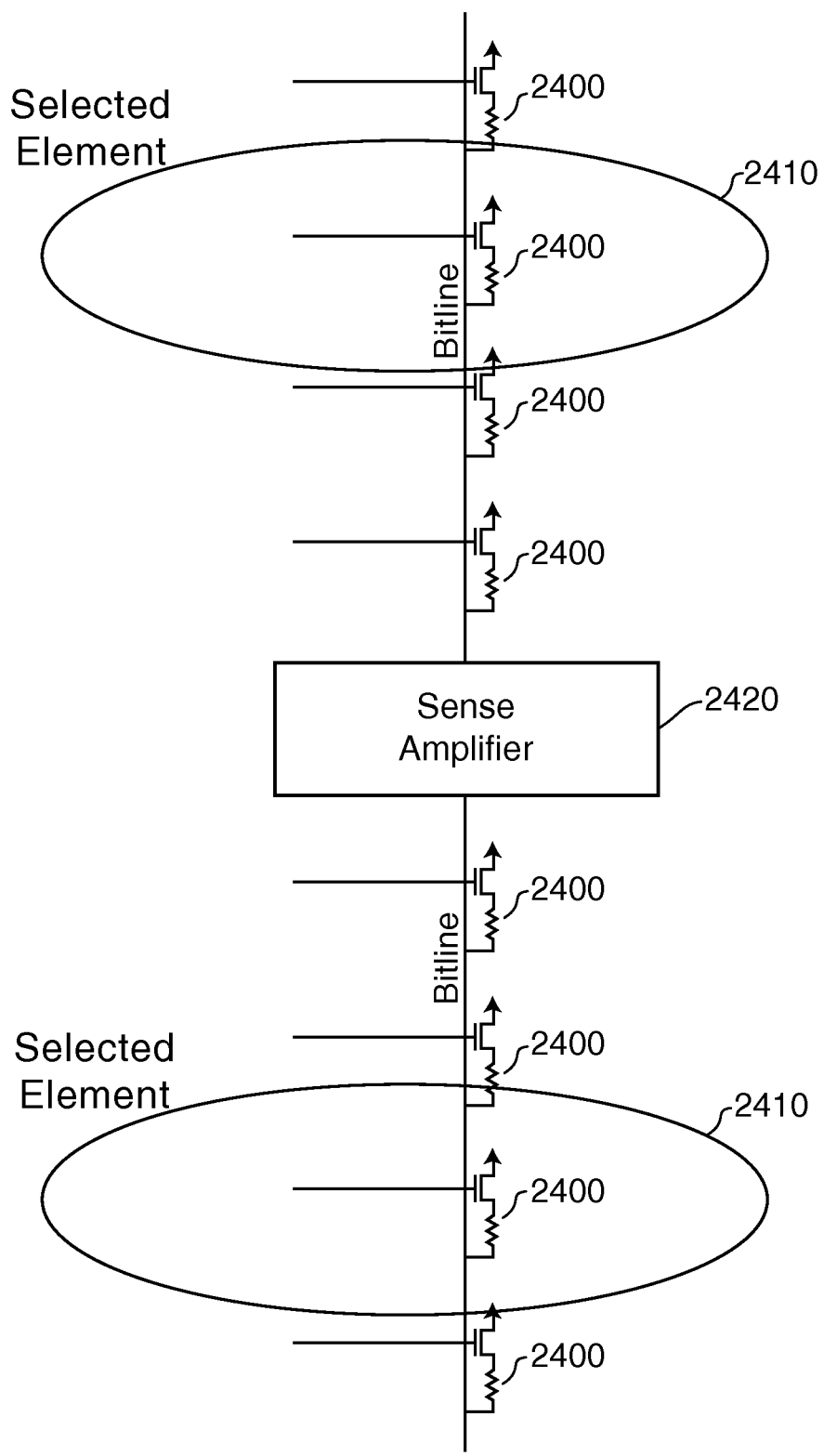
FIG. 2I shows an example of a PCM single ended sensing memory.
Figure 2J:
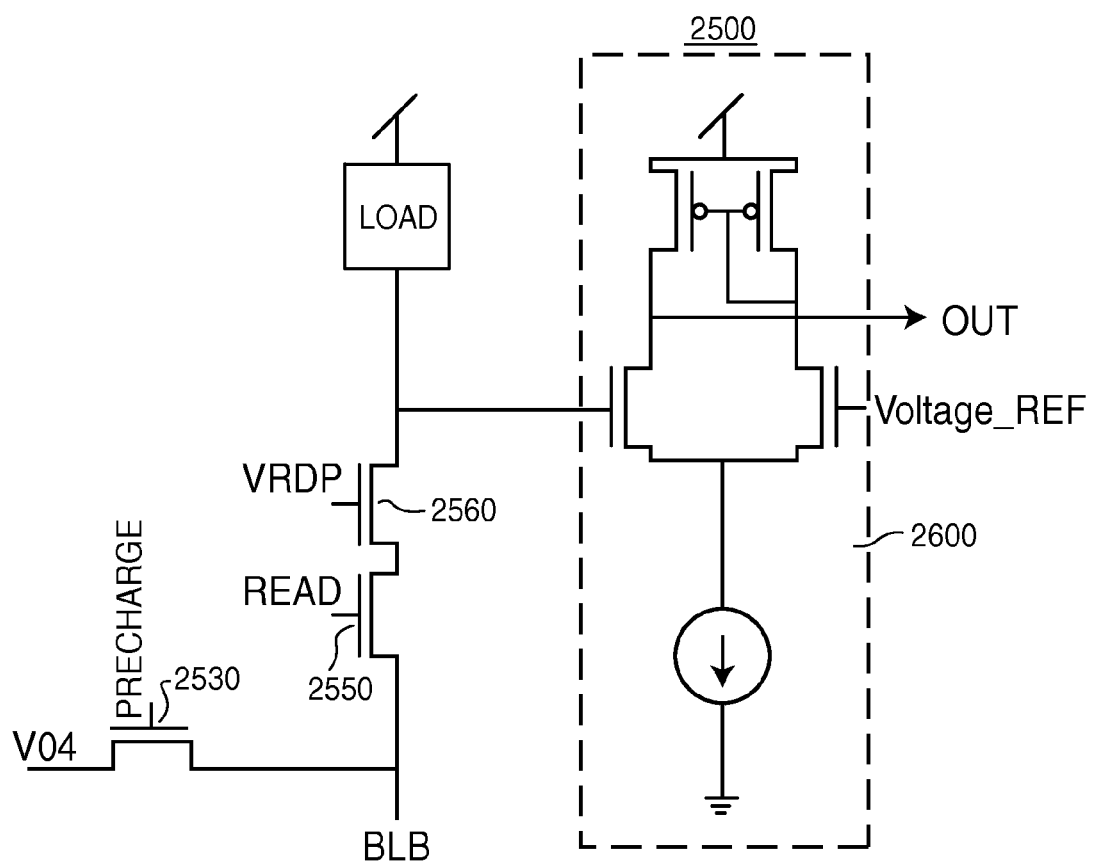
FIG. 2J shows an example of a known PCM single ended sense amplifier.

The numerous innovative teachings of the present application will be described with particular reference to presently preferred embodiments (by way of example, and not of limitation). The present application describes several inventions, and none of the statements below should be taken as limiting the claims generally.

Generally, the phase-change materials used in phase change memory (PCM) are subject to resistance "drift"; resistance levels of one or more states change over time. This is a particularly dangerous problem in multibit PCM, since, over the long term, outputs corresponding to different cell states can become confused. For example, lower intermediate states may become confused with higher intermediate states as a resistance level of one drifts past an original (pre-drift) resistance level of another.

PCM materials also typically experience resistance changes as a result of temperature changes, even though the temperature changes are insufficient to cause state change. This, too, can cause difficulty in state discrimination.

The present application discloses new multibit phase change memory architectures. Data is stored in groups of n n-bit cells, where every one of the n possible states appears in exactly one of the n cells. Each group of cells is read out at the same time, and differential sensing permits the collective state of the group to be read accurately. Since it is predetermined that each cell group contains all possible states, each cell group provides its own reference.

The use of collective states means that each group of n n-bit cells can have any one of n! (n factorial) states. For example, with 3 states per cell, a group of three cells is collectively encoded, and 6 collective states (3 factorial) are possible. Three comparators produce three digital outputs to indicate which collective state is present. (Each collective state corresponds to a unique set of digital outputs, but not every combination of digital outputs corresponds to a possible collective state.) With four 4-state cells, 24 collective states are possible. Six comparators provide six outputs, and each of the 24 collective states corresponds to some value of these six bits. Note that the collective states of four 4-state cells contain more information than four one-bit cells could. ($4!=24>16=2^n$.)

PCM can be used to make high-density non-volatile RAM memory (PCRAM) in a variety of interfaces. Multi-bit PCM can be used to increase storage density and data throughput of PCM memories. However, the resistance levels corresponding to bit states in multi-bit PCM are closer together, and thus more difficult to discriminate, than in single-bit PCM.

The present application teaches that cells within a group are read by comparison with each other rather than against a reference voltage. This is achieved by using fully differential sensing, rather than single ended sensing. For groups of n n-state cells, the number of comparisons required is "n choose 2," i.e. the binomial coefficient of n over 2. NO REFERENCE VALUES as such are required: instead, the different cell outputs are simply compared with each other.

Since the temperature and drift histories of the grouped cells are closely linked, comparison of read outputs of the grouped cells can be relied on to show the proper ordering. For example, if cells A, B and C are grouped, and A, B and C are written so that their outputs are ordered A>B>C, later reads of this group state can be relied on to produce outputs corresponding to the resistance ordering A>B>C.

Since each group of cells provides its own reference, the whole group has to be located (approximately) together, and the whole group has to be read out at (approximately) the same time.

Groups of cells can be associated with a single address. Receipt of an address by a memory will result in accessing the entire group of cells.

In preferred embodiments, where PCM cells can have n nonvolatile states, groups of cells are assigned n members, and are written so that groups do not contain repeat instances of states. For example, for groups of four cells that can each have any of four states "1", "2", "3" and "0", group state "2310" is allowed, but group state "2330" is not; and for groups of three cells that can each have any of three states "1", "2", and "0", the allowed group states are "012", "021", "102", "120", "201" and "210". Thus each co-addressed group of k k-state cells can encode up to k! (k factorial) discrete group states.

Preferably, but not necessarily, redundancy information is stored with respect to entire groups containing one or more bad cells, and accesses of such groups are redirected to different groups of cells. Alternatively, less than all of the cells in such a group (e.g., only the defective cell) can be allocated redundancy information, and accesses to such cells redirected to other cells within the memory.

FIG. 1 shows an example of a Multi-Differential Multi-Bit PCM memory 10. In this example, each co-addressed group includes four 4-bit cells, so there are 24 possible collective states in each group. Thus five bits of data are required to specify one of these collective states, and six differential stages are used to perform fully differential sensing.

In write mode, the memory 10 receives a data input 20 of at least 5 bits, together with an address 70 which specifies one of the co-addressed groups of cells (shown as the group 50 in this example) within the memory subarray 60. The data input 20 selects the appropriate write routine for each cell of the group 50. (Those routines will be optimized for the particular phase-change material and parameters are being used.)

When a read request is received, the address 70 selects a co-addressed group of cells 50, and those four cells are accessed to produce four output currents $I_{cell1}$-$I_{cell4}$. Six pairwise sense operations are performed using differential sense stages 80, so that all possible pairs of the four cell outputs are used. (These are $I_{cell1}$-$I_{cell2}$, $I_{cell1}$-$I_{cell3}$, $I_{cell1}$-$I_{cell4}$, $I_{cell2}$-$I_{cell3}$, $I_{cell2}$-$I_{cell4}$, and $I_{cell3}$-$I_{cell4}$.) For simplicity the sense stages 80 are shown as comparators, but typically these would include at least one analog differential stage followed by at least one digital gain stage.

The six sense stages 80 produce six digital outputs 100. These six bits are translated to five bits in stage 110, to provide a 5-bit output 120. Multiple such outputs 110 can be combined to cover however much data resolution is required.

Figure 3A:
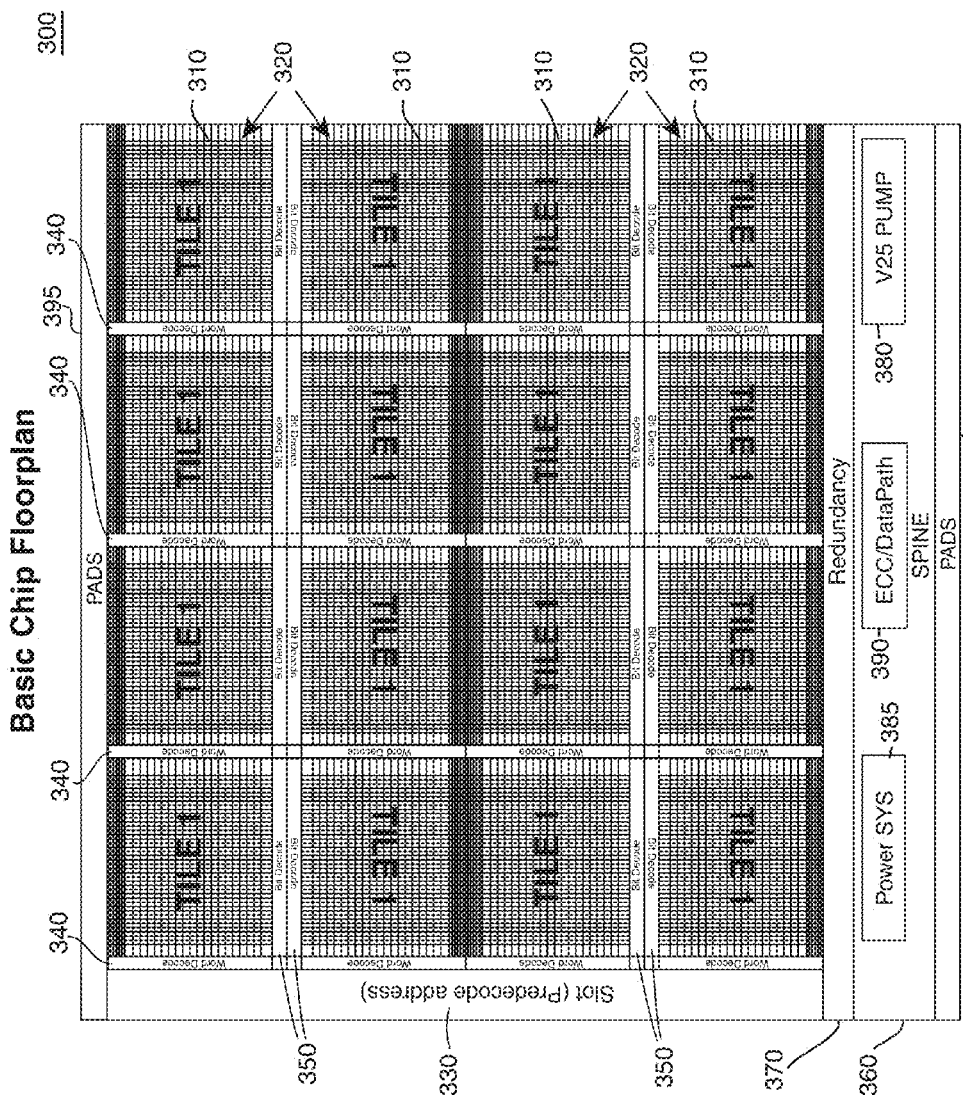
FIG. 3A shows an example of a MDMB PCM memory floor plan.
Figure 4:
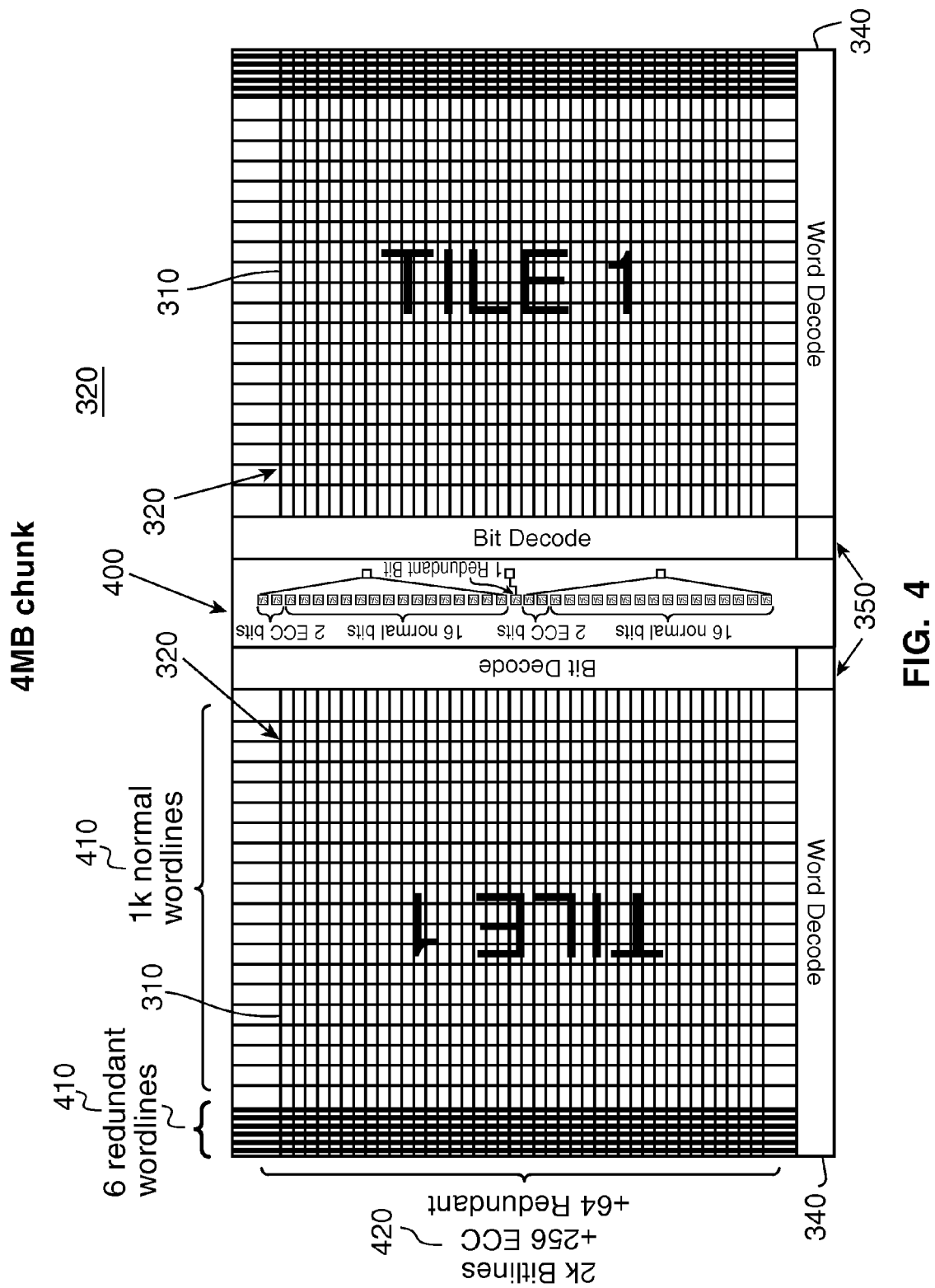
FIG. 4 shows an example of a portion of a memory.
Figure 5:
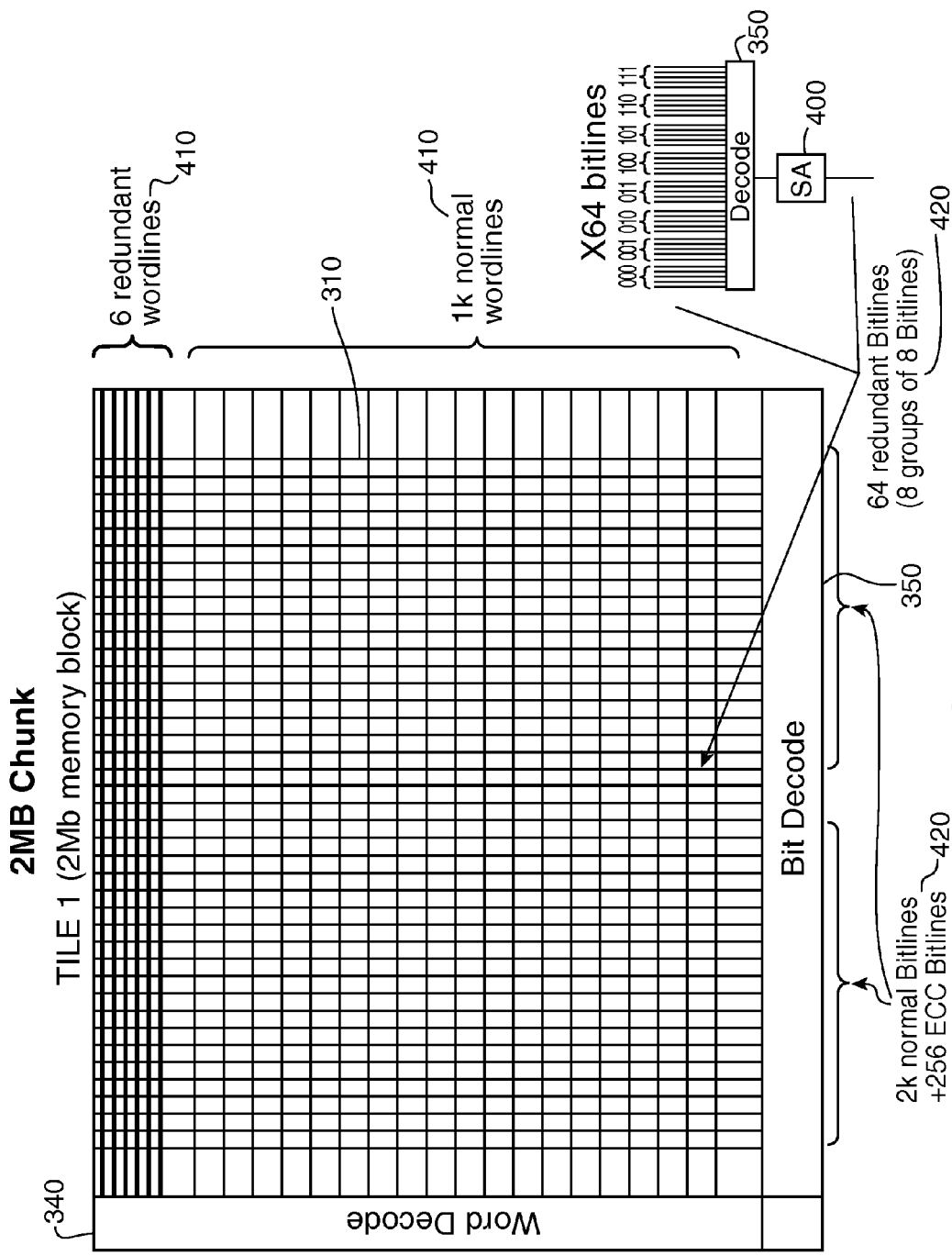
FIG. 5 shows an example of a portion of a memory.

FIG. 3A shows an example of a floor plan 300 for a complete PCM chip. Tiles 310 are memory portions that can be implemented e.g. as shown in FIG. 5. Tile pairs 320 are memory portions that can be implemented e.g. as shown in FIG. 4. The SLOT area 330 includes logic for taking a pre-decode address, splitting it into wordline and bitline components, and sending the wordline and bitline components to the corresponding word decode (340) and bit decode (350) logic in the corresponding memory tiles 310 (TILE 1).

The Spine area 360 includes redundancy logic 370, which compares addresses received by the memory to permanently programmed redundancy information to determine when a memory access needs to be redirected to redundancy memory components. Also located here is a voltage pump 380 (which produces 2.5V in this example). Block 385 block contains reference and regulated power (voltage and current) supplies. ECC/DataPath block 390 uses error correction code bits for repairing soft memory fails. Datapath logic that interprets data, encodes it into an output format (e.g., serial) and streams it out of the chip. Pad locations 395 are also shown, and multiple contact pads would typically be located in each.

Figure 3B:
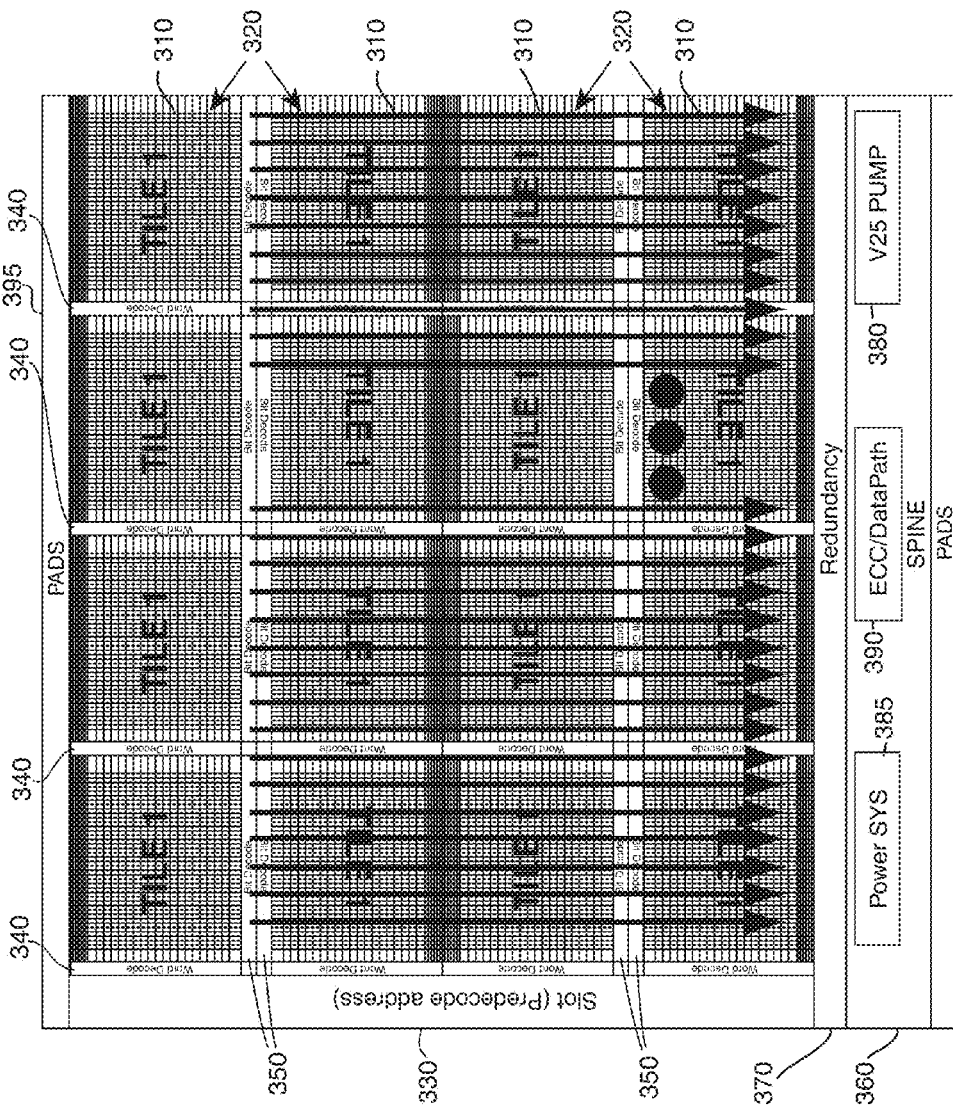
FIG. 3B shows an example of data flow in a Multi-Differential Multi-Bit PCM memory.

FIG. 3B shows an example of data flow in a Multi-Differential Multi-Bit PCM memory. The memory shown here uses three cells per group, and three states per cell with differential sense amplifiers. Each large arrowed line corresponds to an output line (which is preferably buffered to drive long distance, for outputs (see., e.g., OutA, OutB and OutC in FIG. 9a) of a sensed group of cells. Generally, it is advantageous to use $$\frac{\text{number of sense amplifiers} * \text{width of chip in tiles} * 2}{\text{number of cells in a group}}$$

output lines 397 where (as here) pairs of tiles 320, each pair of tiles 320 with its own set of sense amplifiers, face each other.

FIG. 4 shows an example of a portion of a MDMB PCM memory comprising a pair of tiles 320. Two 2 MB chunks of memory 310 (Tiles) are tiled together to share 37 sense amplifiers, which include 32 normal sense amplifiers, 4 for error correction (ECC), and 1 for redundancy (Redundant Bit). Numbers of normal, ECC and redundancy sense amplifiers 400 can be different in other embodiments. FIG. 4 also shows an example allocation of space to various structures. FIG. 4 shows 1024 normal and 6 redundant wordlines 410 per tile 310; and 2056 normal, 256 error correction code (ECC) and 64 redundant bitlines 420.

FIG. 5 shows an example of a portion of a MDMB PCM memory. The 2 MB chunk of memory 310 (Tile) shown comprises 1024 normal and 6 redundant wordlines 410 accessed using Word Decode 340 logic that, inter alia, decodes a word portion of an address received by the memory into a word portion of an address of a corresponding group; and 2048 normal, 256 ECC (error correction code) and 64

Redundant (in 8 groups of 8) Bitlines 420 accessed using Bit Decode 350 logic that, inter cilia, decodes a bitline portion of an address received by the memory into a bitline portion of an address of a corresponding group.

Figure 6:
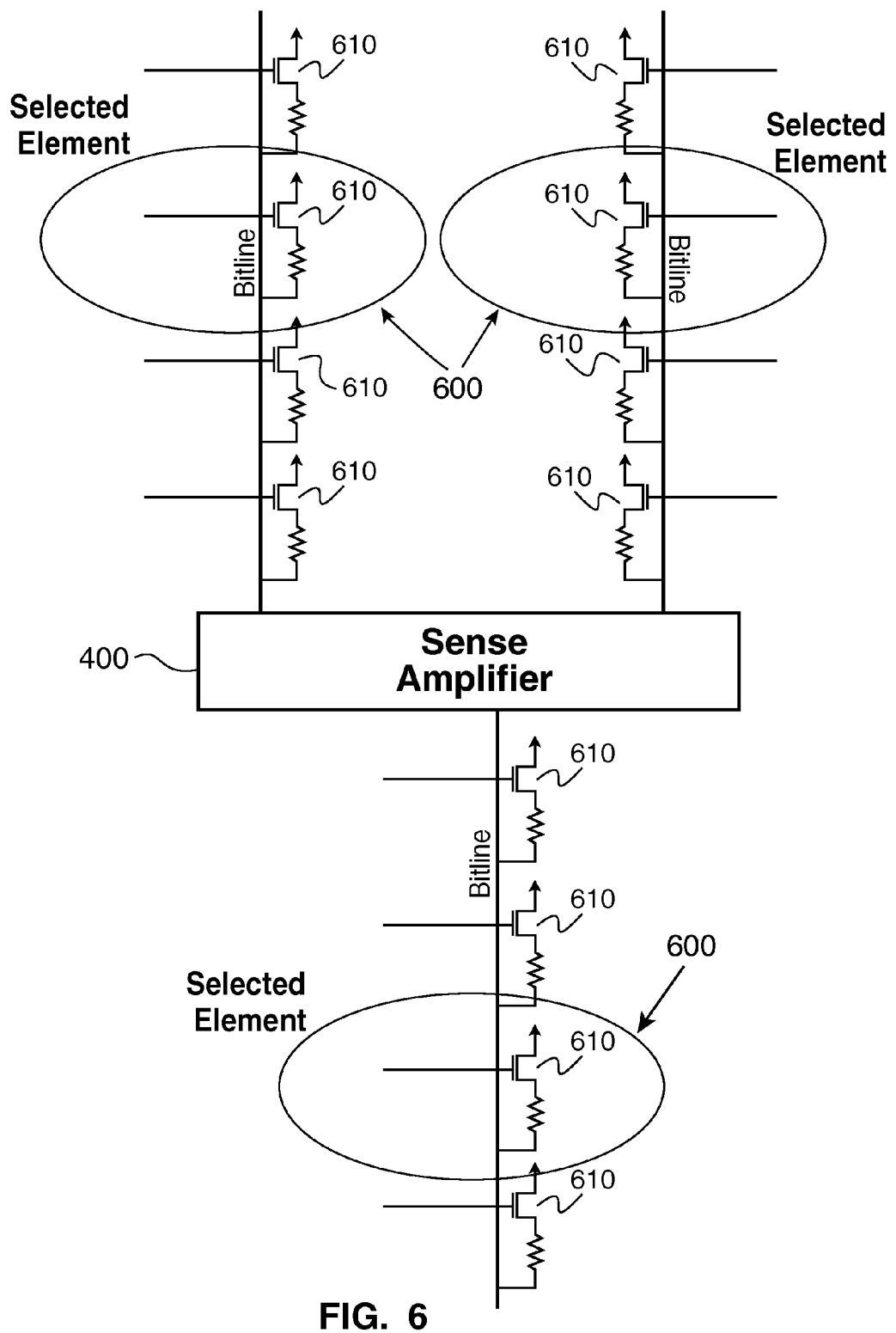
FIG. 6 shows an example of a selected group of PCM cells.

FIG. 6 shows an example of a selected group of co-addressed PCM cells 600. The three circled PCM cells 610 are three parts of ONE co-addressed group 600.

Figure 7:
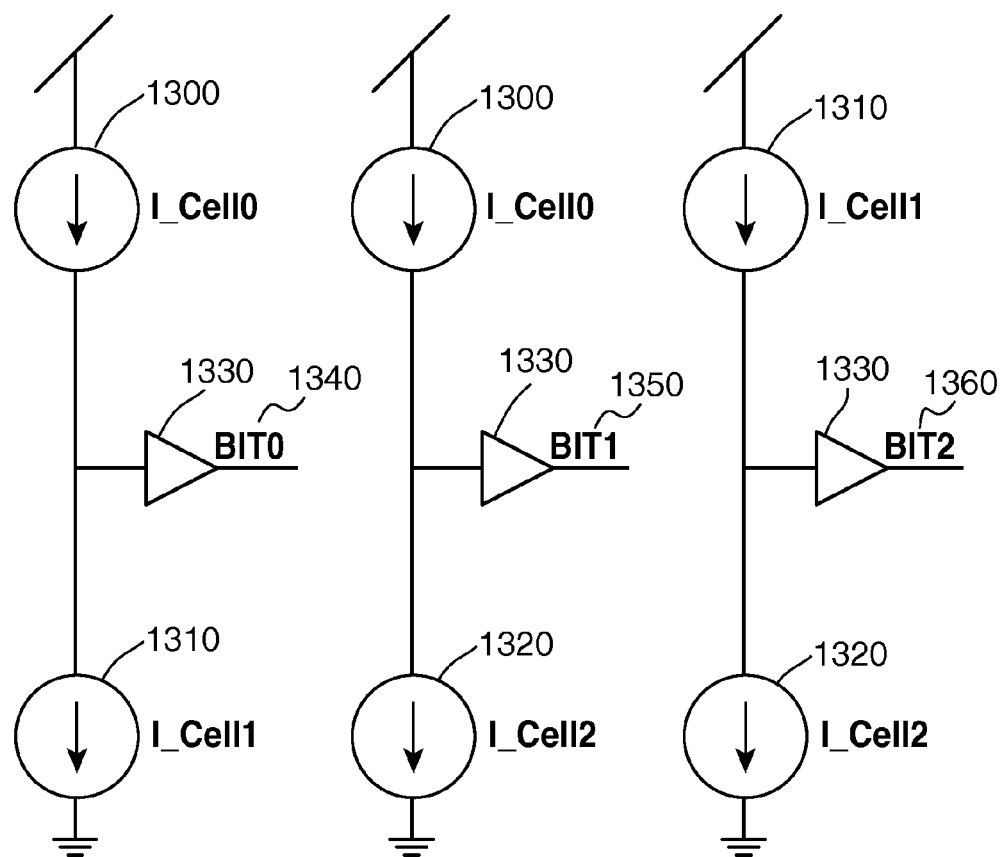
FIG. 7 schematically shows a multi-bit PCM differential sensing memory system.

FIG. 7 schematically shows an example of multi-bit PCM differential sensing, particularly the three cells per group, three states per cell case. For cells Cell0, Cell1 and Cell2 with respective output currents I_Cell0 1300, I_Cell1 1310 and I_Cell2 1320, differential comparison blocks 1330 perform pair-wise comparisons of the output currents 1300, 1310, 1320 and output results Bit0 1340, Bit1 1350 and Bit2 1360 depending on which compared pair is currents is greater—one member being greater results in a pull-up to a voltage source value, and the other member being greater results in a pull-down to ground.

Figure 8A:
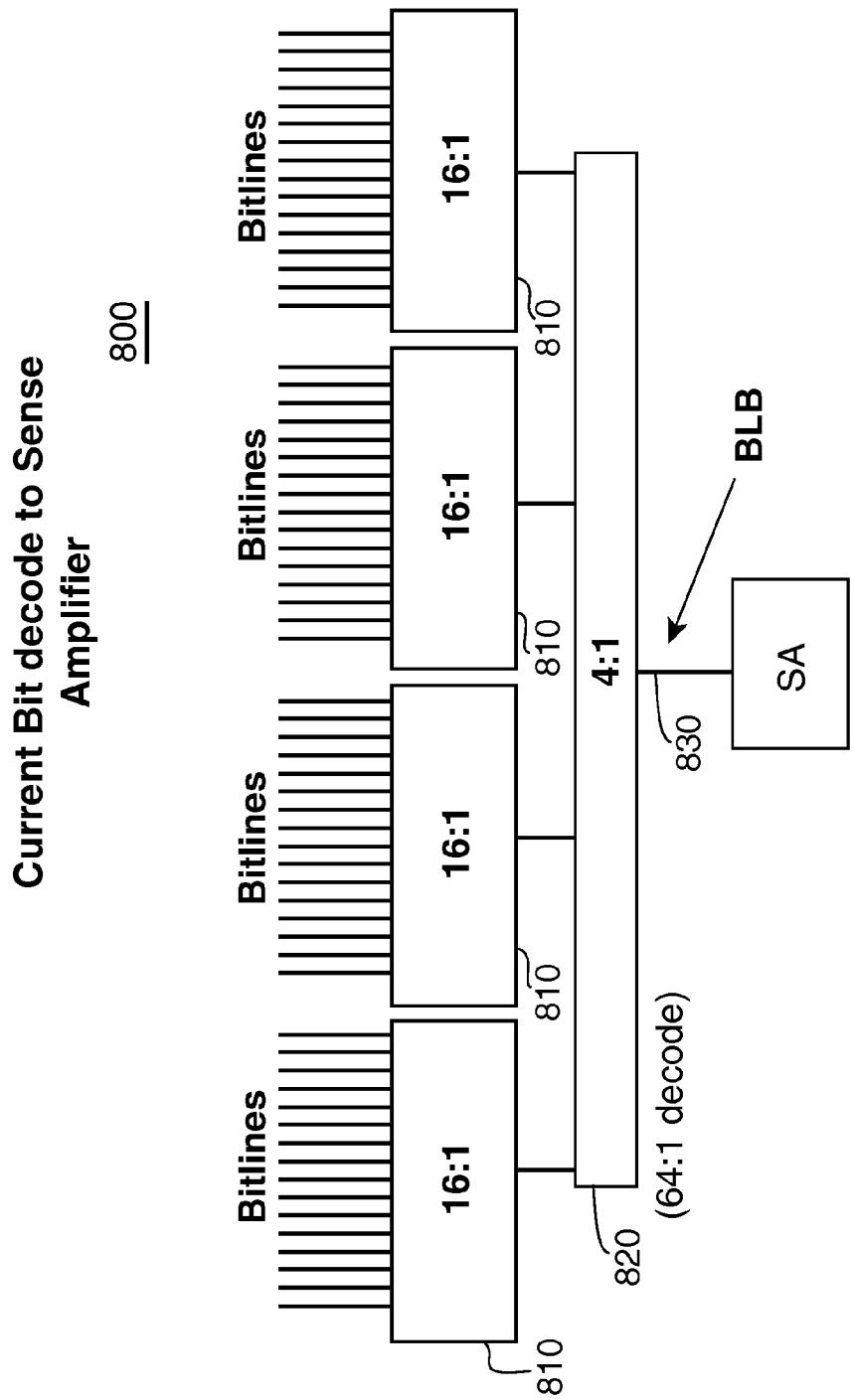
FIG. 8A shows an example of a bitline decoder for a sense amplifier.

FIG. 8A shows an example of a 64:1 bitline decoder 800 for a sense amplifier 400. The 64:1 bitline decoder 800 uses four 16:1 bitline multiplexers 810 (muxes), fed into a 4:1 mux 820, to produce an input 830 (BLB) to a sense amplifier 400 corresponding to an accessed cell 610, e.g., a cell that is a member of an accessed group 600. Multiple decoders 800 can be used simultaneously, e.g., one decoder 800 per sense amplifier 400, to allow memory accesses to be made in parallel.

Figure 8B:
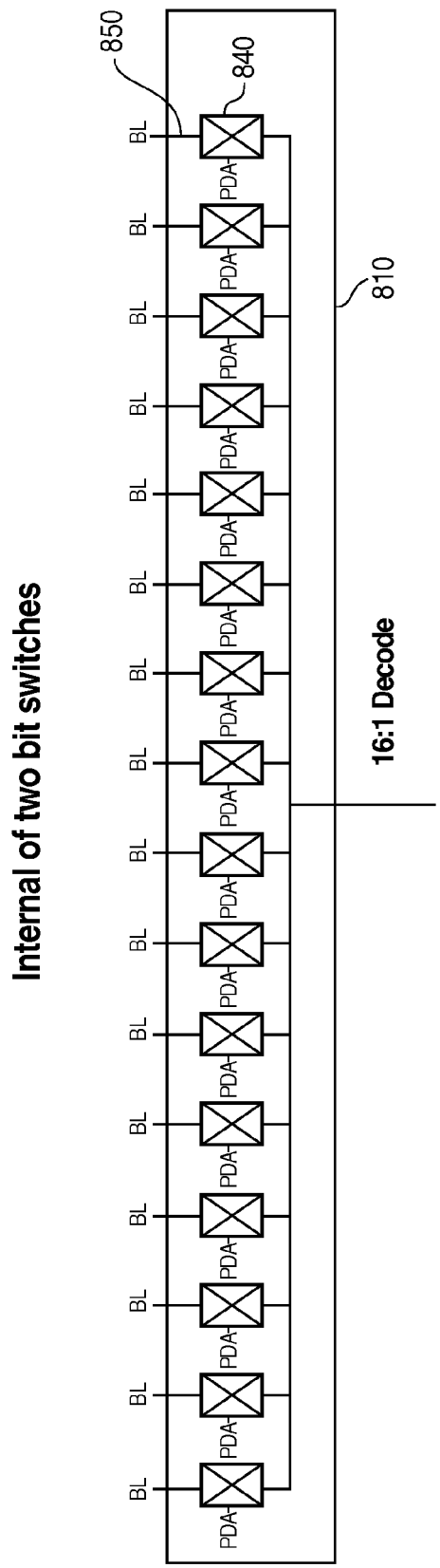
FIGS. 8B and 8C show examples of bitline multiplexers.
Figure 8C:
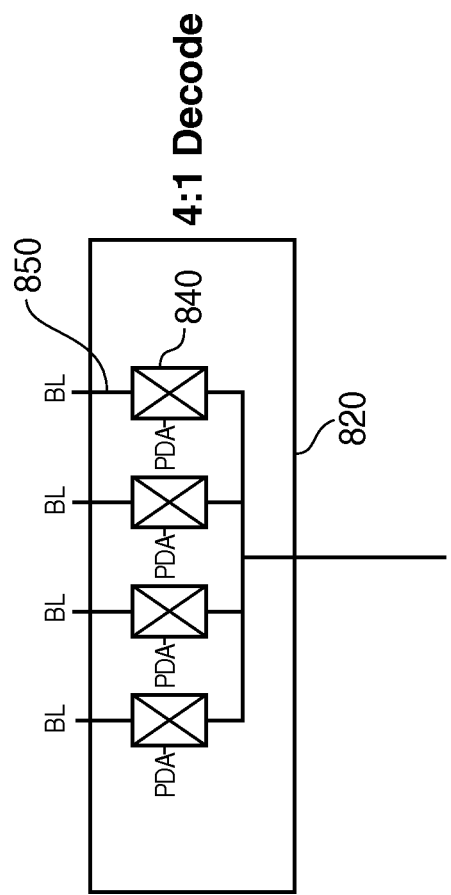

FIGS. 8B and 8C shows an example of detail of 16:1 810 and 4:1 820 bitline muxes, where pre-decoded addresses 840 (PDA) select bitlines 850 corresponding to the member cells 610 (for FIG. 8C, corresponding to 16:1 muxed groups of member cells 610) of a selected co-addressed group 600, the outputs of which are to be sense amplified.

Figure 9A:
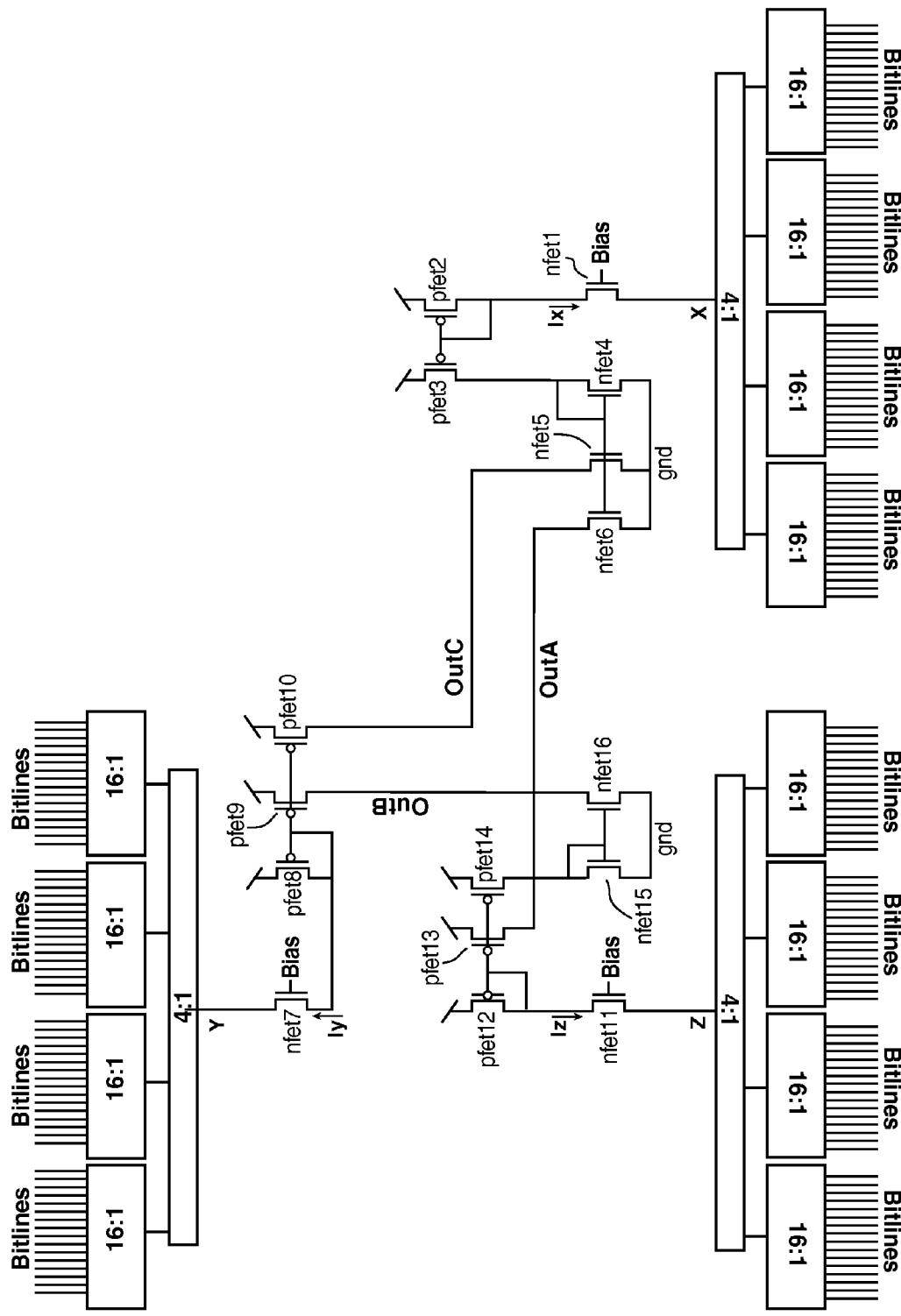
FIG. 9A shows an example of a Multi-Differential Multi-Bit sense amplifier.

FIG. 9A shows an example of a Multi-Differential Multi-Bit sense amplifier. This MDMB differential sense amplifier embodiment handles three cell groups, three states per cell.

Input X from bitline decoder BLD$_X$ enters nFET 1. nFET 1 is configured as a source follower; given the Bias applied to the gate of nFET 1, nFET 1 source is fixed at a particular voltage so that nFET 1 has a current output I$_X$. Put differently, the gate forces a voltage on the bitline selected in bitline decoder BLD$_X$ and transforms the bitline output into a current output. pFET 2 is diode connected, i.e., the drain and gate are connected together and to the output of nFET 1, i.e., I$_X$. pFET 2 and pFET 3 (the sources of which are connected to a voltage source, e.g., V$_{dd}$) are matched to form a current mirror with ratio 1:1, and together they mirror the source follower output current I$_X$ from the drain of pFET 3 to the drain and gate of diode connected nFET 4 and the gates of nFETs 5 and 6. nFETs 4, 5 and 6 are matched, and current mirror I$_X$ to nFET 5 and 6 outputs OutA and OutC.

Input Y from bitline decoder BLD$_Y$ enters nFET 7. nFET 7 is configured as a source follower with gate input Bias. nFET 7 current output I$_Y$ is input to the gate and drain of diode connected pFET 8 and to the gates of pFETs 9 and 10 (sources of pFETS 8, 9 and 10 are connected to a voltage source, e.g., V$_{dd}$). pFETs 8, 9 and 10 are matched, and current mirror I$_Y$ to pFET 9 and 10 outputs OutB and OutC.

Input Z from bitline decoder BLD$_Z$ enters nFET 11. nFET 11 is configured as a source follower with gate input Bias. nFET 7 current output I$_Z$ is input to the gate and drain of diode connected pFET 12 and to the gates of pFETs 13 and 14 (sources of pFETS 12, 13 and 14 are connected to a voltage source, e.g., V$_{dd}$). pFETs 12, 13 and 14 are matched, and current mirror I$_Z$ to pFET 13 output OutA and to nFET 15 gate and drain (nFET 15 is diode connected) and nFET 16 gate.

nFET 15 and 16 sources are connected to ground. I$_Z$ is current mirrored to nFET 16 output OutB.

OutA equals I$_X$+I$_Z$; OutB equals I$_Y$+I$_Z$; and OutC equals I$_X$+I$_Y$. Depending on which of each pair of currents comprising, respectively, OutA, OutB, and OutC is greater, the voltages of OutA, OutB and OutC will be driven to the supply voltage (e.g., V$_{dd}$) or to ground, depending on which of supply or ground the source of the respective outputting transistor was connected to (nFETs 5 and 6, I$_X$, to ground, pFETs 9 and 10, I$_Y$, to source, pFET 13, I$_Z$, to source, and nFET 16, I$_Z$, to ground).

Figure 9B:
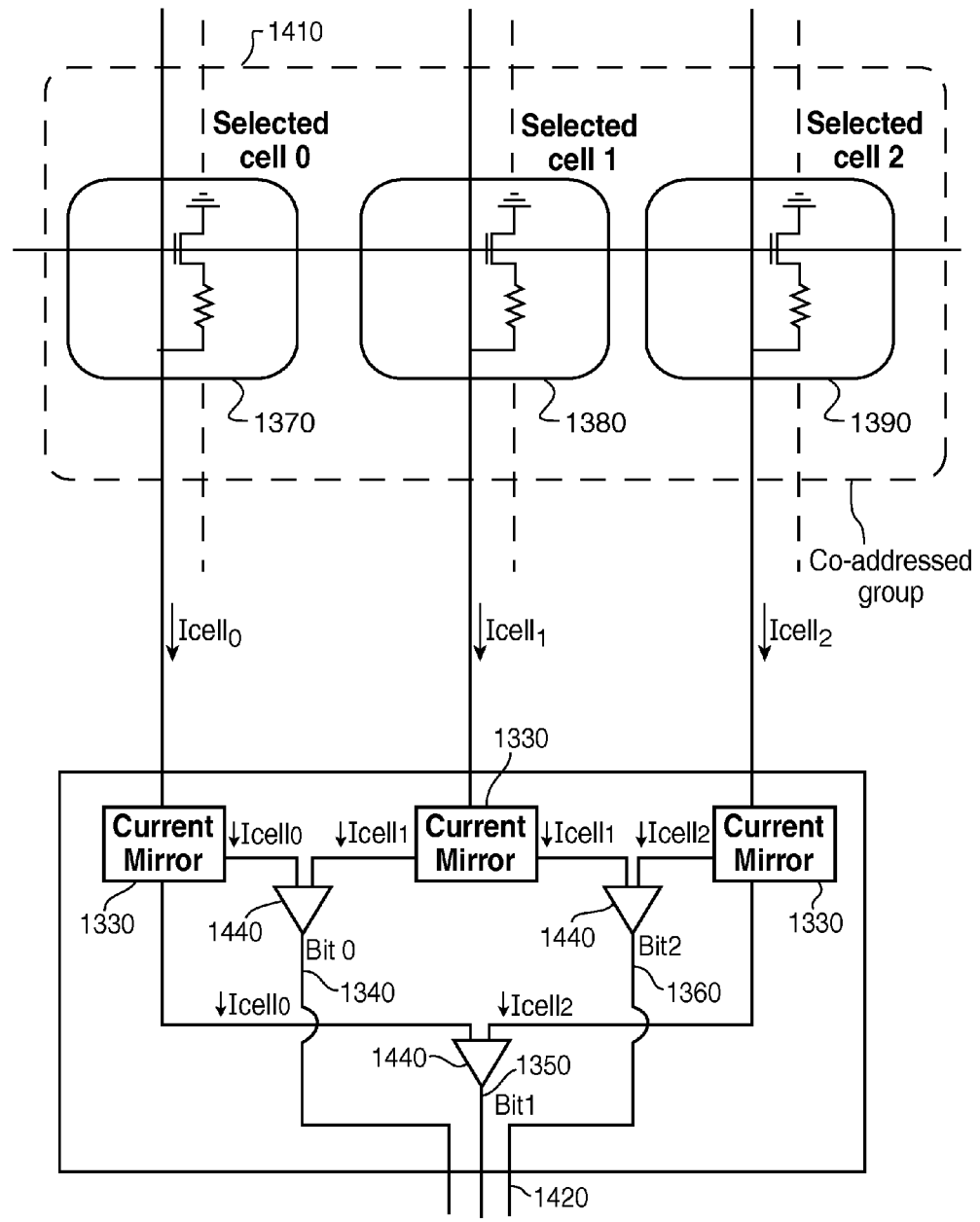
FIG. 9B schematically shows an example of multi-bit PCM differential sensing.

FIG. 9B schematically shows an example of multi-bit PCM differential sensing. The figure shows an example of the three cells per group, three states per cell case. As shown, selected cells cell_0 1370, cell_1 1380 and cell_2 1390 in a co-addressed group 1410 provide respective output currents I$_{cell0}$, I$_{cell1}$, and I$_{cell2}$. These currents are mirrored by current mirrors 1330. (The mirrors 1330 are unity gain in this example, but can optionally include some gain.)

The mirrored currents are compared to each other by differential stages 1440. Stages 1440 provide digital outputs, and hence can be thought of as comparators, but they may include some analog stages too for additional gain. The first stage of differential sense amplifiers is of course analog in nature. This results output bits 1420, corresponding to the collective state of the co-addressed group 1410.

Figure 9C:
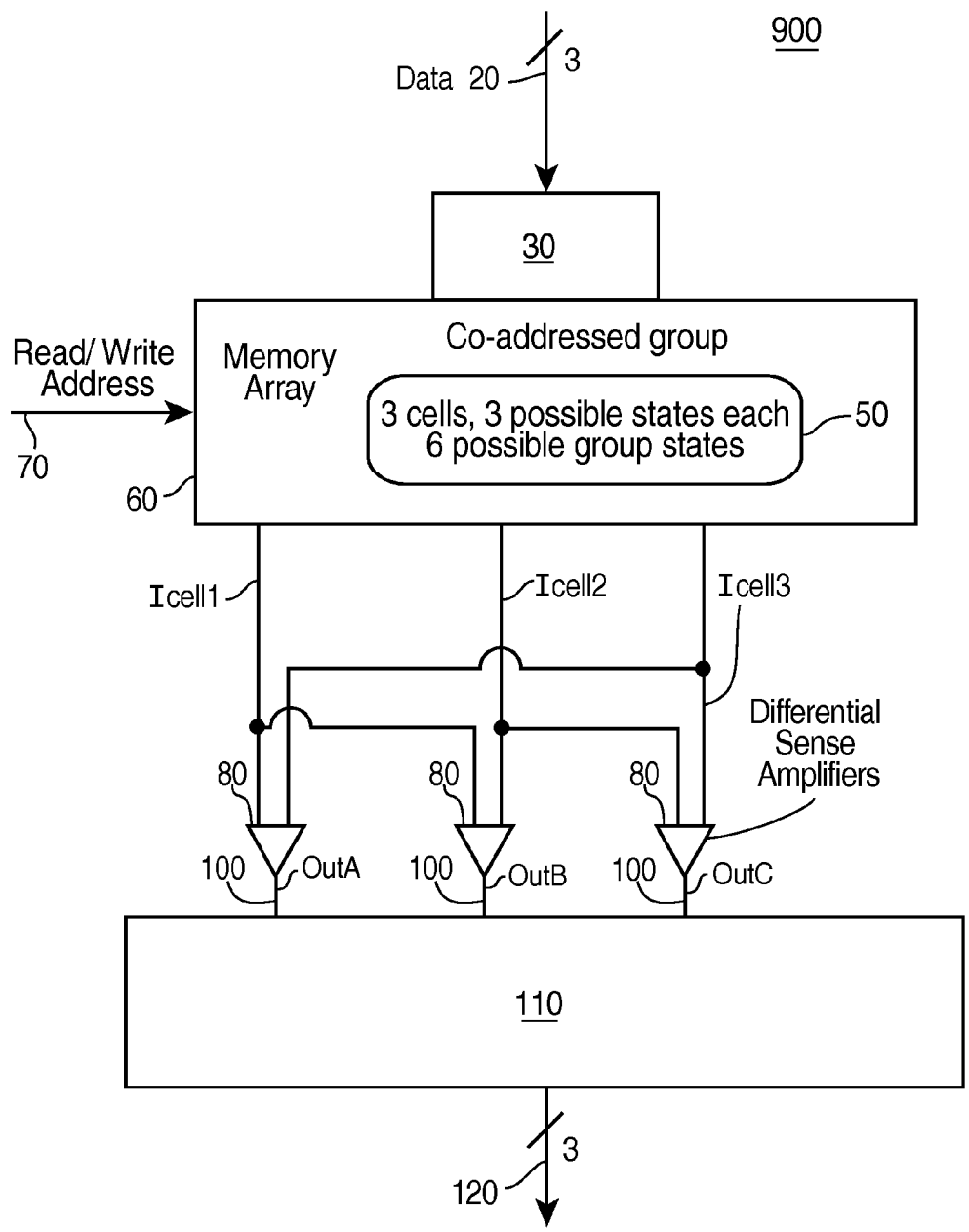
FIG. 9C shows an example of a Multi-Differential Multi-Bit PCM memory.

FIG. 9C provides a higher-level view of an example of a Multi-Differential Multi-Bit PCM memory 900. Block 30 calls the routines which write the data 20 onto the corresponding cells of a co-addressed group 50 (in subarray 60, at address 70). In this example, each of the co-addressed groups 50 includes exactly three 3-state cells.

In read mode, all three cells in the selected co-addressed group 50 are accessed, and three (binomial coefficient 3 choose 2) pair-wise comparisons are performed using differential sense amplifiers and comparators 80. The three resulting digital 100 are buffered by block 110 to produce 3 binary outputs 120.

Figure 9D:
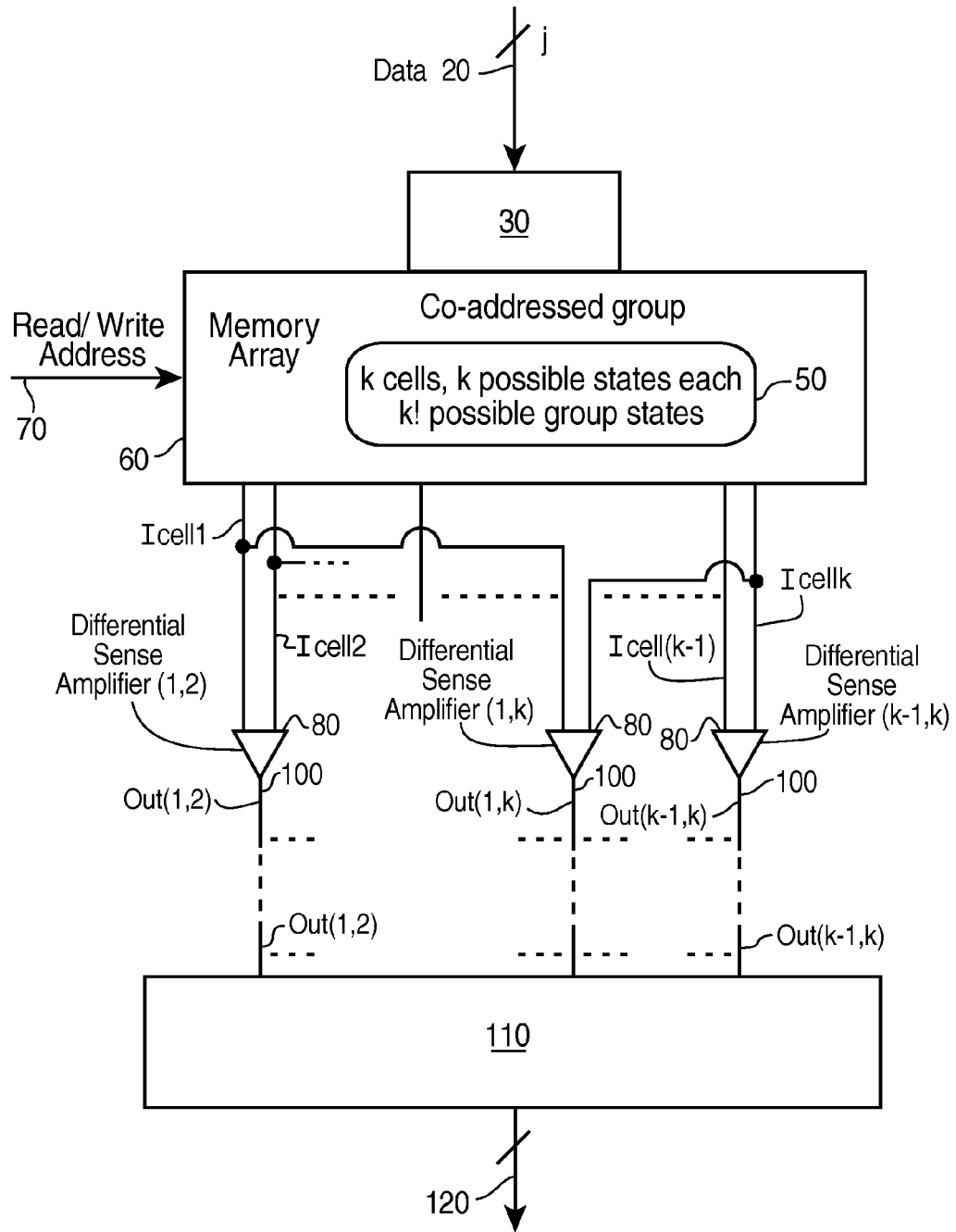
FIG. 9D shows an example of a generalized Multi-Differential Multi-Bit PCM memory.

FIG. 9D shows a more general example of a generalized Multi-Differential Multi-Bit PCM memory. In this example each co-addressed group 50 includes k k-state PCM cells in a memory array 60. The co-addressed group 50 can represent up to k! (k factorial) different states.

When a write occurs, block 30 will call the appropriate routines to write a different one of k possible states into each one of the group 50 of k PCM cells, corresponding to the data received on lines 20

On a read request, k cells in the co-addressed group 50 corresponding to an address 70 (Read/Write Address) are accessed, and $$\binom{k}{2}$$

(binomial coefficient k choose 2) pair-wise comparisons are performed using differential stages 80. The $$\binom{k}{2}$$

differential sense amplifier outputs 100 are decoded in a Decode block 110 to produce j binary outputs 120, generally corresponding to the j inputs 20 that were encoded and written to the group of cells 50 accessed in response to the read request.

Note that, with the three 3-state cells used in the example of FIGS. 9B and 9C, decoding is not strictly necessary. This is because 3!=3, and the next higher power of 2 is eight ($2^3$). However, for k=4 (four 4-state cells), or any higher number k of k-state cells, k!>$2^k$, so more than k binary lines are needed for data output.

Figure 10:
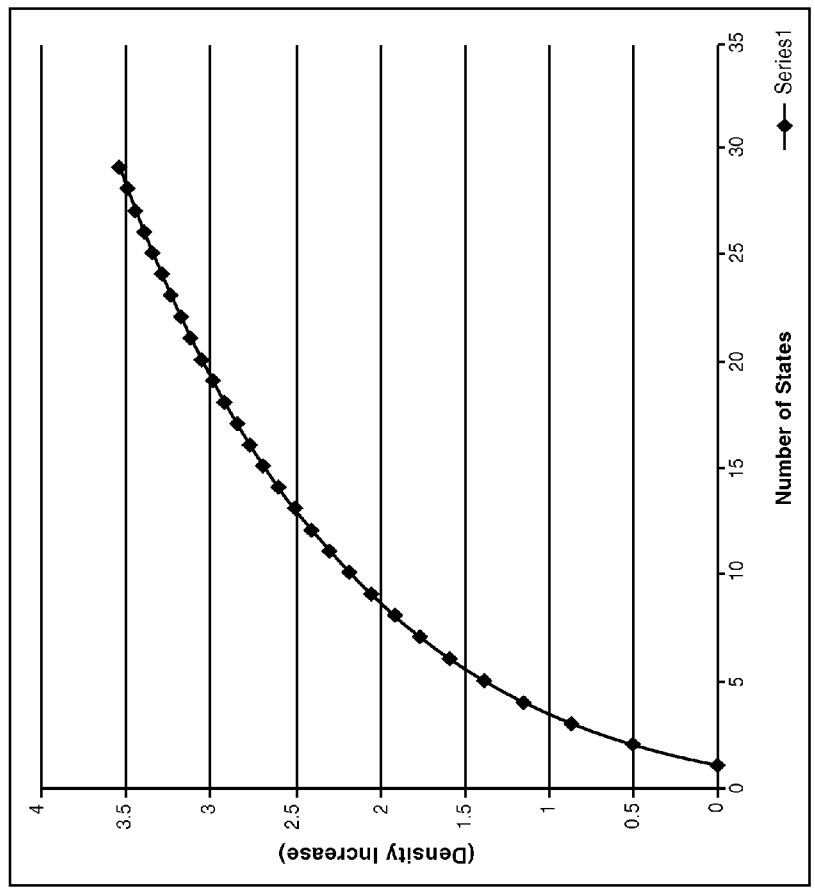
FIG. 10 shows an example of a graph of number of states against memory density in some embodiments, with a table showing the graphed values.

FIG. 10 shows an example of a graph of number of states against memory density in some embodiments, with a table showing the graphed values. For 4 states per cell, with single ended sensing, where n is the number of cells, the number of states that can be encoded is $4^n$. For 2 states per cell, the number of states that can be encoded is $2^n$. For some embodiments, the increase in memory density for given n states per cell, n cells per co-addressed group, can be calculated as follows.

Y=proportional density increase over a two state single ended sensing memory.

X=the number of states that can be encoded in a multi-bit PCM cell in a memory using co-addressed groups with X cells.

$$Y = \frac{\log_2 X!}{X}$$

As shown in FIG. 10, differential sensing, using typical (two-state) differential sensing with four cells per group, four states per cell allows approximately a 14% increase in memory density as against a two state per cell memory using single ended sensing.

Figure 11A:
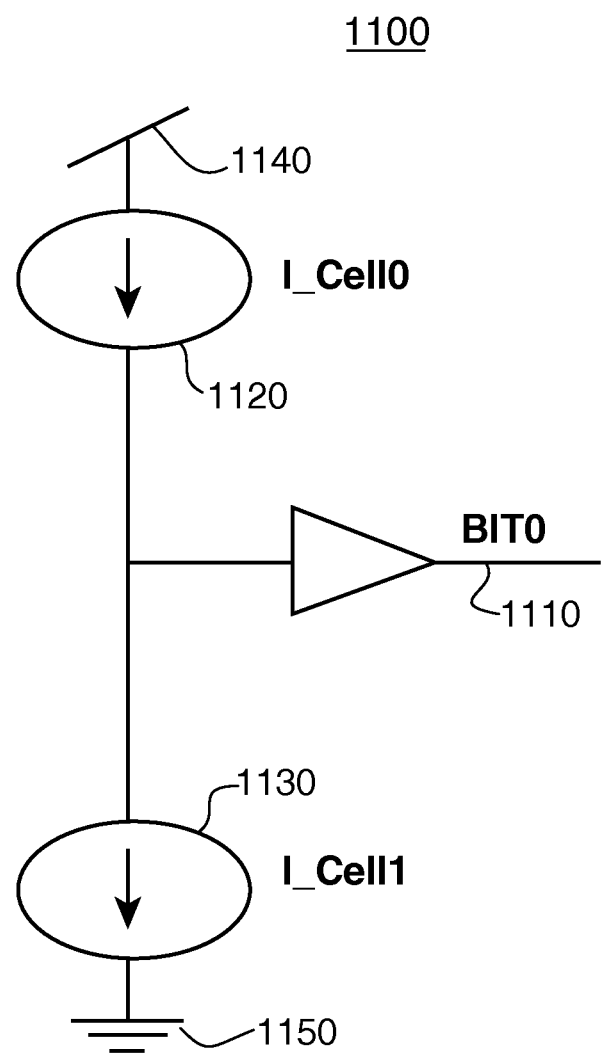
FIG. 11A shows an example of a differential sense amplifier.

FIG. 11A shows an example of a differential sense amplifier 1100. The output Bit0 1110 depends on which read output current is greater, I_Cell0 1120 or I_Cell1 1130. If I_Cell0 1120 is greater, the output Bit0 1110 will be pulled up to the source voltage 1140, and if I_Cell1 1130 is greater, the output Bit0 1110 will be pulled down to ground 1150.

FIG. 11B shows an example of a three cell group, three states per cell state table. When two or more of the three cells have the same state (e.g., 0 0 1 or 2 1 2), a typical differential sense amplifier will produce indeterminate output. Consequently, it is preferred that cases where more than one cell in a group has a given state are disallowed when using a typical differential sense amplifier.

Figure 11C:
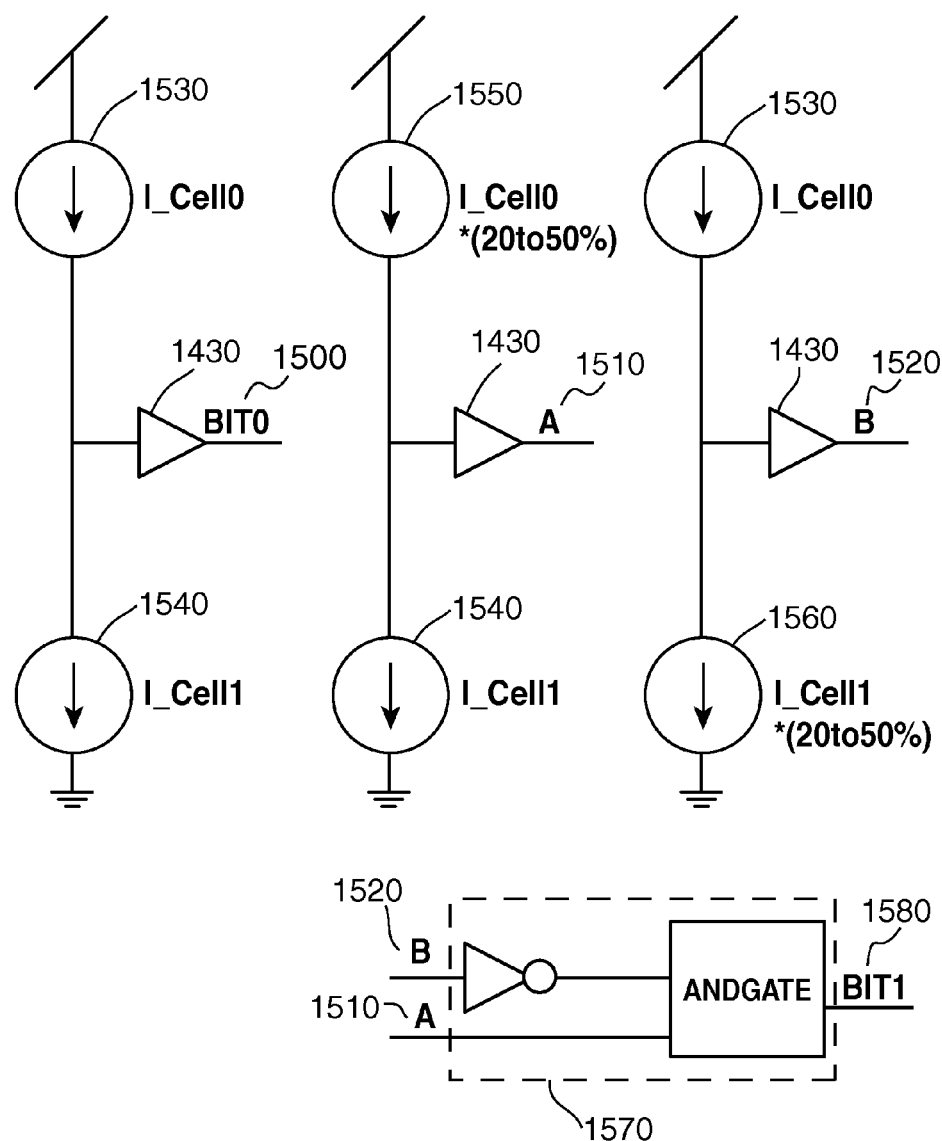
FIG. 11C shows an example of a tristate differential sense amplifier.

FIG. 11C shows an example of a tristate differential sense amplifier. Tristate differential sense amplification can be used to recover additional information states in multi-bit PCM memories using differential sense amplification.

Continuing with two cell groups, two states per cell, a typical differential comparison is performed to obtain BIT0 1500. A 1510 and B 1520 are obtained by multiplying one of each pair of compared cell output currents I_Cell0 1530 and I_Cell1 1540 by a specified proportion (e.g., 20% to 50%, creating I_Cell0*(20% to 50%) 1550 and I_Cell1*(20% to 50%) 1560). The specified proportion is preferably chosen to avoid overlap between possible states. A 1510 and B 1520 are compared by comparison logic 1570; if A 1510 is low and B 1520 is high, the two cells are the same value, and BIT1 1580 is a "Don't Care" (the value of BIT0 1500 is discarded as undetermined). In the two cell group, two states per cell case, use of tristate differential amplifiers can recover at least one additional information state (i.e., the state where the two compared cells have the same phase state). Generally, a tristate differential sense amplifier will not be able to tell by itself which possible state two cells with identical states have been written to.

FIG. 11D shows an example of a three cell group, three states per cell state table. Using tristate differential sense amplifiers, thirteen (13) readably different information states are available. Generally, multiple different stored values in a co-addressed group of cells for which a single inequality holds constitute a single state, because generally, tristate differential sense amplifiers can only detect inequalities. For example, in state 2 in FIG. 11D, where any of three different sets of values in Cell0, Cell1 and Cell2 comprise a single distinct state: Cell0 and Cell1 storing a single value that is less than the value stored by Cell2. Generally, tristate differential sense amplifiers provide co-addressed groups of cells more possible readably distinct states than in two-state differential sense amplifiers; for a three cell group with three states per cell, thirteen (13) readably distinct states instead of six (6).

Figure 12:
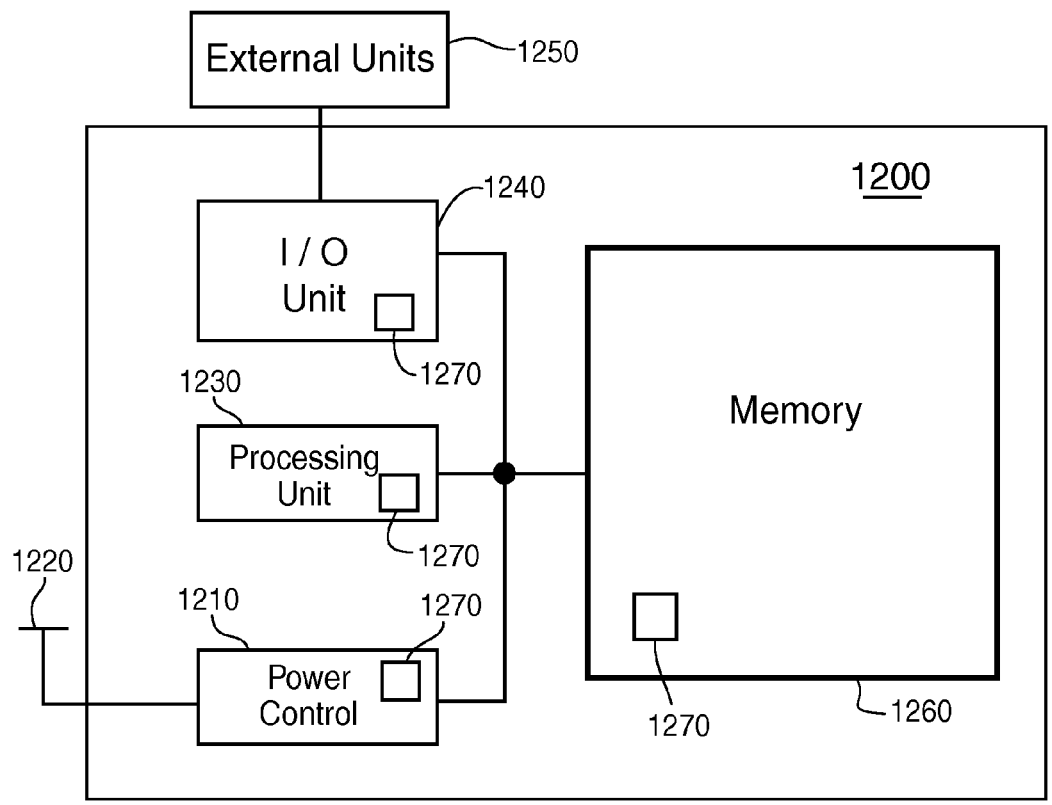
FIG. 12 shows an example of a processing system.

FIG. 12 shows an example of a processing system 1200. Power control 1210 manages distribution of power from a power source 1220 to other components of the processing system. A processing unit 1230 performs processing functions, and an I/O 1240 (input/output) unit operates and manages communications with, and enables other processing system components 1210, 1230, 1240, 1260 to operate and manage communications with, external units 1250. The power control 1210, processing unit 1230 and I/O unit 1240 can also make memory access calls to a memory 1260. Processing system components 1210, 1230, 1240, 1260 perform their functions based on configuration data stored by non-volatile MDMB PCM memory 1270 integrated into respective processing system components 1210, 1230, 1240, 1260. MDMB PCM cells in said MDMB PCM memory 1270 are read Multi-Differential Multi-Bit sense amplifiers.

Configuration data can be loaded into non-volatile memory for runtime accesses. Configuration data can be used to tune PCRAM and other component (e.g., power control 1210, processing unit 1230 or I/O unit 1240) behavior in a design, test, or as-manufactured context. Configuration data can comprise, for example, information used by processing system components to operate external units 1250; redundancy information, used to redirect accesses (read and write requests) from defective or otherwise inoperative memory cells to redundant (backup) memory cells; trim information, generally used to alter the state of an existing topology when device features as-manufactured show variation—which can be expected within some degree of statistical distribution—that can be corrected using measures built into the device; test information used to implement test functions, e.g., for device design, design testing or as-manufactured quality assurance purposes; or to change timing (e.g., sense amp timing, or setup and hold timing in a data path), internal supply voltages, whether ECC (error correction) or other memory or other component functionality is activated, or other component operation parameters (such as word length, instruction set, or whether to use single-ended or MDMB sensing in a particular context).

According to some but not necessarily all embodiments, there is provided: A method of operating a multi-differential multi-bit phase change memory comprising: when a multi-bit write command is directed to a specified write address, accessing a group of more than two multi-bit phase change memory cells corresponding to said write address, and writing a unique logical state corresponding to said write command to each of said cells within said group of cells to define a collective state of said group of cells; and when a multi-bit read command is directed to a specified read address, accessing a corresponding group of said multi-bit phase change memory cells corresponding to said read address, and decoding said collective state in said corresponding group of cells to provide multiple bits of data output.

According to some but not necessarily all embodiments, there is provided: A method of operating a multi-differential multi-bit phase change memory comprising: when a multi-bit write command is directed to a specified write address, accessing a corresponding group of more than two multi-bit phase change memory cells corresponding to said write address, and writing one of n possible logical states corresponding to said write command to each of said cells within said corresponding group to define a collective state of said corresponding group; and when a multi-bit read command is directed to a specified read address, accessing a corresponding group of said multi-bit phase change memory cells corresponding to said read address, and decoding said collective state in said corresponding group of cells to provide multiple bits of data output, wherein reading said corresponding group uses at least one tristate multi-differential multi-bit sense amplifier.

According to some but not necessarily all embodiments, there is provided: A method of operating a multi-differential multi-bit phase change memory comprising: receiving a read request requesting information stored by a group of multiple selected multi-bit phase change memory cells configured to be read together, each of said cells storing a different logical state; current mirroring multiple read output currents of said cells, said read output currents being driven by either a voltage source or ground; adding together multiple different pairs of said read outputs currents, ones of said pairs comprising a read output current driven by said voltage source and a read output current driven by ground; for ones of said pairs of read output current, outputting the driving voltage corresponding to the higher current of said pair as a differential output of said pair; and decoding said differential outputs of said pairs into a binary response to said read request and outputting said binary response.

According to some but not necessarily all embodiments, there is provided: A multi-differential multi-bit phase change memory comprising: a plurality of multi-bit phase change memory cells organized in groups of n>2 co-addressed physical cells, cells within ones of said groups each having a different one of n possible states such that each group of cells can have n factorial (n!) possible collective states, such that when the address corresponding to a particular group is received, the physical cells within said particular group are collectively accessed, so that each cell in said particular group provides an output when said particular group is read; and one or more multi-differential multi-bit sense amplifiers which compare multiple pairs of respective outputs from respective ones of said physical cells within an accessed one of said groups, wherein said sense amplifiers accordingly provide output bits which indicate corresponding nonvolatile states of said multiple physical cells within said respective group.

According to some but not necessarily all embodiments, there is provided: A processing system comprising: a multi-differential multi-bit phase change memory unit, a processor which executes programmable instruction sequences, and an input/output unit; multiple groups of multiple multi-bit phase change memory cells within said multi-differential multi-bit phase change memory unit configured to store configuration data, cells in ones of said groups configured to be written and read contemporaneously; and multiple multi-differential multi-bit sense amplifiers configured to read accessed cells in ones of said groups by comparing pairs of read outputs of said cells against each other and outputting respective logical states of said accessed cells in dependence on said comparing, wherein said processor and/or said input/output unit operate external elements in accordance with said configuration data.

According to some but not necessarily all embodiments, there is provided: A multibit phase change memory comprising: a plurality of phase change memory cells, each having n different states, where n is at least three; address decode logic which translates an access address to identify a group of n cells which lie in the same subarray of phase change memory cells; wherein, when one of said groups is written, each one of the n cells in the group is written with a different respective one of the n different states; and wherein, when one of said groups is read, the output of every cell of that group is compared against the output of every other cell in that group, to thereby provide digital data outputs.

According to some but not necessarily all embodiments, there is provided: Methods and systems for multi-bit phase change memories. Using differential sensing for memory reads provides advantages including improved temperature and drift resilience, improved state discrimination and increased storage density.

According to some but not necessarily all embodiments, there is provided: A method of operating a processing system comprising a multi-differential multi-bit phase change memory unit, a processor which executes programmable instruction sequences, and an input/output unit, comprising: when a multi-bit write command is directed to a specified write address, accessing a group of more than two multi-bit phase change memory cells corresponding to said write address, and writing a unique logical state corresponding to said write command to each of said cells within said group of cells to define a collective state of said group of cells; and when a multi-bit read command is directed to a specified read address, accessing a corresponding group of said multi-bit phase change memory cells corresponding to said read address, and decoding said collective state in said corresponding group of cells to provide multiple bits of data output.

According to some but not necessarily all embodiments, there is provided: Methods and systems for processors and processing systems having multi-bit phase change memories. Using differential sensing for memory reads provides advantages including improved temperature and drift resilience, improved state discrimination and increased storage density.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Embodiments described herein have been disclosed with respect to three- and four-state PCM materials. However, in some embodiments, PCM materials with larger numbers of distinguishable states (e.g., five) can also be used. Some of these have particular advantages.

The number of collective states scales very favorably. For example, a group of five 5-state cells has 120 collective states, i.e. almost 7 bits of data. A group of six 6-state cells has 720 possible collective states, which allows 9 bits of data to be encoded. This permits incremental improvements in process control and sense circuits to be rapidly exploited, without making the difficult transition from 4-state cells to 8-state cells.

As noted above, the histories of the different cells in a single group will be almost precisely identical. The only possible exception is if there is a bias in the frequency of writes (especially Set operations) to some cells of a group. (For example, if a particular group corresponds to a most significant digit of a frequently-updated parameter, the most significant bits might be updated less often than the least significant bits.) However, if this minor source of possible inconsistency is sought to be avoided, digital logic can rotate the data bit assignments periodically. This guarantees uniform wearout tracking.

Some embodiments have been disclosed herein with particular numbers or amounts of structures such as wordlines, bitlines, sense amplifiers, error correction and other bit types, memory cells, decode logics, redundant bitlines and co-addressed group sizes. In some embodiments, various different numbers or amounts of such structures can be used to implement the inventions disclosed herein.

In some embodiments, outputs from physical cells within accessed groups are not compared pairwise. For example, pairs of outputs can be added together and the sums compared.

In some embodiments, more than one physical cell within a co-addressed group is allowed to have a given state. In such embodiments, differential sense amplifiers can use, for example, tri-state logic so that the output equality case can be represented.

In some embodiments, a group of co-addressed cells can contain a different number of PCM cells than the corresponding PCM material has nonvolatile states.

In some embodiments, output values other than current can be compared, e.g., voltage.

In some embodiments, co-addressed cells within a group can be accessed substantially simultaneously when said group is accessed.

In some embodiments, co-addressed cells within a group can be accessed at different times when said group is accessed.

In some embodiments, memory can be switched from differential sense amplification to single ended sense amplification and back.

In some embodiments, divided (unmirrored) currents are compared.

In some embodiments, fewer than all possible states of corresponding PCM cells can be used.

In some embodiments, contents of groups can be rearranged so that groups are comprised of different sets of cells from prior to being rearranged.

In some embodiments, duplicate instances of a state can be stored within a group of cells.

In some embodiments, a memory could use differential sensing for some bitlines, and single ended sensing for other bitlines.

In some embodiments, a memory could use a lower signal margin to obtain higher storage density at the expense of longer sense and/or write times. In other embodiments, a memory could use a higher single margin to obtain higher sense and/or write times at the expense of lower storage density.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

Additional general background, which helps to show variations and implementations, can be found in the following publications, all of which are hereby incorporated by reference: Lam, "Phase Change Memory: A Replacement or Transformational Memory Technology," IEEE Workshop on Microelectronics and Electron Devices (WMED), 2011; Choi et al., "A 20 nm 1.8V 8 Gb PRAM with 40 MB/s Program Bandwidth," ISSCC 2012; U.S. Pat. No. 8,259,490 for "Multi-level Phase-Change Memory Device and Method of Operating Same"; U.S. Pat. No. 8,238,147 for "Multi-Level Phase Change Memory Device, Program Method Thereof, and Method and System Including the Same"; Papandreou et al., "Multi-Level Phase Change Memory", $17^{th}$ IEEE International Conference on Electronics, Circuits and Systems (ICECS) 2010, at 1017-1020; Papandreou et al., "Drift-Tolerant Multilevel Phase-Change Memory", $3^{rd}$ IEEE International Memory Workshop (IMW) 2011, at 1-4.

Additional general background, which helps to show variations and implementations, as well as some features which can be synergistically with the inventions claimed below, can be found in the following US patent applications. All of these applications have at least some common ownership, copendency, and inventorship with the present application, and all of them are hereby incorporated by reference: U.S. Provisional Pat. Nos. 61/637,331; 61/637,496; 61/637,513; 61/637,518; 61/637,526; 61/637,533; 61/638,217; 61/694,217; 61/694,220; 61/694,221; 61/694,223; 61/694,224; 61/694,225; 61/694,228; 61/694,234; 61/694,240; 61/694,242; 61/694,243; and 61/694,245.

The claims as filed are intended to be as comprehensive as possible, and NO subject matter is intentionally relinquished, dedicated, or abandoned.

What is claimed is:

1. A method of operating a multi-differential multi-bit phase change memory comprising:
   when a multi-bit write command is directed to a specified write address, accessing a group of more than two multi-bit phase change memory cells corresponding to said write address, and writing a unique logical state corresponding to said write command to each of said cells within said group of cells to define a collective state of said group of cells; and
   when a multi-bit read command is directed to a specified read address, accessing a corresponding group of said multi-bit phase change memory cells corresponding to said read address, and decoding said collective state in said corresponding group of cells to provide multiple bits of data output.

2. The method of claim 1, wherein an ordering of said logical states written to said group of cells comprises an encoding of the information specified to be written by said write command.

3. The method of claim 1, wherein said collective state is read by a multi-differential multi-bit sense amplifier.

4. The method of claim 1, wherein said multi-differential multi-bit sense amplifiers compare each possible pair of respective outputs from cells in said group of cells to produce a binary encoded output corresponding to said collective state.

5. The method of claim 1, wherein said multi-bit phase change memory cells can store up to n distinct logical states, wherein said group of cells contains n cells, and wherein writing said group of cells comprises writing said n distinct logical states to said n cells in said group of cells.

6. The method of claim 1, wherein cells in said group of cells are read or written substantially simultaneously.

7. A method of operating a multi-differential multi-bit phase change memory comprising:
   when a multi-bit write command is directed to a specified write address, accessing a corresponding group of more than two multi-bit phase change memory cells corresponding to said write address, and writing one of n possible logical states corresponding to said write command to each of said cells within said corresponding group to define a collective state of said corresponding group; and
   when a multi-bit read command is directed to a specified read address, accessing a corresponding group of said multi-bit phase change memory cells corresponding to said read address, and decoding said collective state in said corresponding group of cells to provide multiple bits of data output,
   wherein reading said corresponding group uses at least one tristate multi-differential multi-bit sense amplifier.

8. The method of claim 7, wherein an ordering of said logical states written to said group comprises an encoding of the information specified to be written by said write command.

9. The method of claim 7, wherein said corresponding group comprises n of said multi-bit phase change memory cells.

10. The method of claim 7, wherein said tristate multi-differential multi-bit sense amplifiers compare each possible pair of respective outputs from cells in said group of cells to produce a binary encoded output corresponding to said collective state.

11. The method of claim 7, wherein multiple cells in said corresponding group can store the same logical state at the same time.

12. The method of claim 7, wherein cells in said group of cells are read or written substantially simultaneously.

13. A method of operating a multi-differential multi-bit phase change memory comprising:
   receiving a read request requesting information stored by a group of multiple selected multi-bit phase change memory cells configured to be read together, each of said cells storing a different logical state;
   current mirroring multiple read output currents of said cells, said read output currents being driven by either a voltage source or ground;
   adding together multiple different pairs of said read outputs currents, ones of said pairs comprising a read output current driven by said voltage source and a read output current driven by ground;
   for ones of said pairs of read output current, outputting the driving voltage corresponding to the higher current of said pair as a differential output of said pair; and
   decoding said differential outputs of said pairs into a binary response to said read request and outputting said binary response.

14. The method of claim 13, wherein an ordering of said logical states written to said group of cells encodes a collective state of said group of cells.

15. The method of claim 13, wherein said multi-bit phase change memory cells can store up to n distinct logical states, wherein said group of cells contains n cells, and wherein writing said group of cells comprises writing said n distinct logical states to said n cells in said group of cells.

16. The method of claim 13, wherein cells in said group of cells are read or written substantially simultaneously.

* * * * *